United States Patent
Shakeshaft

(10) Patent No.: US 7,813,444 B2
(45) Date of Patent: Oct. 12, 2010

(54) MEASUREMENT METHOD AND ARRANGEMENT FOR AMPLITUDE AND PHASE SYNCHRONIZATION IN A POLAR TRANSMITTER

(75) Inventor: Niall Eric Shakeshaft, Helsinki (FI)

(73) Assignee: Nokia Corporation, Espoo (FI)

( * ) Notice: Subject to any disclaimer, the term of this patent is extended or adjusted under 35 U.S.C. 154(b) by 956 days.

(21) Appl. No.: 11/402,636

(22) Filed: Apr. 11, 2006

(65) Prior Publication Data

US 2007/0237258 A1    Oct. 11, 2007

(51) Int. Cl.
    *H04L 27/00* (2006.01)
(52) U.S. Cl. ............... 375/295; 375/219; 375/298; 375/296; 375/302
(58) Field of Classification Search ......... 375/219, 375/295, 297; 455/423, 102; 331/17
    See application file for complete search history.

(56) References Cited

U.S. PATENT DOCUMENTS

| | | | |
|---|---|---|---|
| 6,909,757 | B2 | 6/2005 | Justice et al. |
| 7,181,205 | B1* | 2/2007 | Scott et al. .............. 455/423 |
| 2002/0168020 | A1* | 11/2002 | Justice et al. .............. 375/295 |
| 2004/0183602 | A1* | 9/2004 | Maunuksela et al. ......... 331/17 |
| 2004/0219891 | A1* | 11/2004 | Hadjichristos ............. 455/102 |
| 2004/0247041 | A1 | 12/2004 | Biedka et al. |
| 2005/0069026 | A1* | 3/2005 | Vepsalainen et al. ........ 375/219 |
| 2006/0045205 | A1 | 3/2006 | Jensen |
| 2006/0057976 | A1 | 3/2006 | Klemmer |
| 2006/0067427 | A1 | 3/2006 | Zolfaghari et al. |
| 2007/0183532 | A1* | 8/2007 | Matero .................... 375/297 |

OTHER PUBLICATIONS

T. Sowlati, et al; "Quad-band GSM/GPRS/EDGE Polar Loop Transmitter;" IEEE Journal of Solid-State Circuits, vol. 39, No. 12, pp. 2179-2189; Dec. 2004; whole document.

Frederick H. Raab; "Intermodulation Distortion in Kahn-Technique Transmitters"; IEEE Transactions on Microwave Theory and Techniques, IEEE Service Center, Piscataway, NJ; vol. 44, No. 12; Dec. 1, 1996; whole document.

Steve C. Cripps; "RF Power Amplifiers for Wireless Communications"; 1999, Artech House, XP002552927; ISBN: 0-89006-989-1; pp. 180-181, pp. 203-204; and p. 208.

T. Grydeland, et al; "A procedure to correct the effects of a relative delay between the quadrature components of radar signals at base band"; Annales Geophysicae (Online), Jan. 31, 2005; XP002552815; retrieved from Internet: http://www.ann-geophys.net/23/39/2005/angeo-23-39-2005.pdf on Oct. 28, 2009; whole document and Figures 1-3.

(Continued)

*Primary Examiner* — Sudhanshu C Pathak
(74) *Attorney, Agent, or Firm* — Alfred A. Fressola; Ware, Fressola, Van Der Sluys & Adolphson LLP

(57) ABSTRACT

A method and arrangement is shown for measuring an indicator of delay mismatch between a phase information path and an amplitude information path of a polar modulator. In the solution according to the invention a substantially sinusoidal measurement signal (301, 302) is injected both into the amplitude information path (351) and into the phase information path (352). An indicator of the delay mismatch is obtained by measuring a quantity that is proportional to a difference between power represented by a lower side band of a spectrum of a polar modulated signal and power represented by an upper side band of the spectrum.

29 Claims, 11 Drawing Sheets

OTHER PUBLICATIONS

David K. Su, et al; "An IC for Linearizing RF Power Amplifiers using Envelope Elimination and Restoration"; IEEE Journal of Solid-State Circuits, IEEE Service Center, Piscataway, NJ; vol. 33, No. 12; Dec. 1, 1998; XP011060907; whole document.

G. Seegerer, et al; "Edge Transmitter with Commercial GSM Power Amplifier Using Polar Modulation with Memory Predistortion"; 2005 IEEE MTT-S International Microwave Symposium, Piscataway, NJ, Jun. 12, 2005; pp. 1553-1556; whole document.

* cited by examiner

MEASUREMENT METHOD AND ARRANGEMENT FOR AMPLITUDE AND PHASE SYNCHRONIZATION IN A POLAR TRANSMITTER

FIELD OF THE INVENTION

The present invention generally relates to wireless communication and particularly relates to a measurement method and an arrangement for amplitude and phase synchronization in a polar transmitter.

BACKGROUND OF THE INVENTION

Wireless communication standards, such as GSM (Global System for Mobile Communication), EDGE (Enhanced Data Rates through GSM Evolution), and WCDMA (Wideband Code Division Multiple Access), require a variety of digital modulation formats like 4-PSK, 8-PSK (Phase Shift Keying), and various QAM implementations (Quadrature Amplitude Modulation). A general trend of evolution in the field of wireless communication is an aim for increased data rates (bits/second) and increased spectral efficiency (bits/Hertz).

Using a traditional linear modulation method, such as a traditional Cartesian QAM, imposes stringent linearity requirements for a power amplifier of a transmitter. Biasing the power amplifier to linear operating points may satisfy said linearity requirements, but does so at the expense of power efficiency of the power amplifier, i.e. power losses in the amplifier are increased.

Polar transmitters employing polar modulation methods are alternatives to transmitters employing conventional linear modulation methods. In a polar modulation method a complex valued base-band signal to be modulated up to an RF-band (Radio Frequency) is represented using polar co-ordinates, amplitude and phase, instead of using Cartesian in-phase and quadrature co-ordinates. A significant advantage of polar modulation is the fact that it can be used when using a high efficiency power amplifier such as a Class-C, Class-E, Class-F, or saturated Class-B power amplifier. This is because such amplifiers are highly non-linear and cannot pass signals that have amplitude modulation present without severe spectral re-growth and distortion. Thus an input signal of the power amplifier must have phase modulation only and no amplitude modulation, i.e. RMS-power (Root Mean Square) of said input signal must be sufficiently constant. Amplitude modulation is then applied to an output signal in a power supply of the power amplifier.

A generic concept for a polar modulator is illustrated in FIG. 1. The polar modulator 100 has two input signals: a base-band amplitude signal 101 and a base-band phase signal 102. Amplitude information and phase information are both included in an input data signal 109. Said base-band amplitude signal and base-band phase signal are formed from said input data signal 109 with base-band processing means 120. The base-band phase signal 102 is an input signal of a phase modulator 110. The input data signal, the base-band amplitude signal, and the base-band phase signal are functions of time (t). The phase modulator can be e.g. a voltage-controlled oscillator an input voltage of which is proportional to a time derivative of the base-band phase signal 102. An output signal 103 of the phase modulator 110 is a phase modulated signal an instantaneous phase of which depends on the base-band phase signal 102. The phase modulated signal 103 can be modelled with the following equation:

$$Ph(t)=A \sin(2\pi f_c t+\Phi(t)), \quad (1)$$

where Ph(t) denotes the phase modulated signal 103 as a function of time, A is a constant amplitude of the phase modulated signal 103, $\Phi(t)$ denotes an instantaneous value of the base-band phase signal 102 as a function of time, and $f_c$ is a center frequency of the phase modulated signal 103. Information of the base-band phase signal is included in an instantaneous phase of the phase modulated signal. Without loosing generality the amplitude A can be chosen to be unity (=1). The center frequency $f_c$ can be a final carrier frequency of a transmitter or it can be an intermediate frequency.

The output signal 103 is multiplied by the base-band amplitude signal 101 in an amplitude modulator 111. An output signal of the amplitude modulator is a polar modulated signal 104. The polar modulated signal can be modelled as:

$$P(t)=R(t)\sin(2\pi f_c t+\Phi(t)), \quad (2)$$

where P(t) denotes the polar modulated signal 104 as a function of time and R(t) denotes an instantaneous value of the base-band amplitude signal 101 as a function of time. If a dc-component of the base-band amplitude signal 101 is substantially zero the amplitude modulator produces a polar modulated signal in which the center frequency is suppressed. An advantage of having the center frequency suppressed is the fact that a smaller power is required to reach a desired signal-to-noise ratio in a communication path. A significant disadvantage is the fact that when the base-band amplitude signal is allowed to change its sign an instantaneous phase of the polar modulated signal depends not only on the base-band phase signal but also on the sign of the base-band amplitude signal. This makes a receiver that receives the polar modulated signal more complicated compared with a case in which the base-band amplitude signal is all the time positive or negative.

An inherent problem of polar modulation is the fact that the phase $\Phi(t)$ information and the amplitude information R(t) have to be very accurately synchronized with each other in the polar modulated signal P(t) in order to avoid significant distortion and spectral spreading in the polar modulated signal.

In the remainder of this document a signal path via which the amplitude information of the input data signal 109 is transferred to the polar modulated signal 104 is called an A-path (Amplitude information path) and a signal path via which the phase information of the input data signal 109 is transferred to the polar modulated signal 104 is called a P-path (Phase information path).

Real polar modulators include analog blocks and thus the signal propagation delay in both the A-path and the P-path varies according to component and process variation. An analog block can be for example a gain unit or a unit that adds a DC-offset to a signal. Thus it is necessary to include an adjustable delay element in either the A-path or P-path, or both. This is illustrated in FIG. 2. An adjustable delay element 231 in the A-path and an adjustable delay element 232 in the P-path must ensure that a propagation delay on the A-path and a propagation delay on the P-path are sufficiently close to each other. For example, in a GSM-EDGE application the maximum delay mismatch that can be practically tolerated is $T_s/128$, where $T_s$ is a GSM-EDGE symbol period. In this case the maximum allowable delay mismatch is approximately 29 ns.

Although it is common knowledge that delays on the A-path and on the P-path have to be adjusted with each other, working out when the P-path and the A-path are synchronized is a more difficult task.

DESCRIPTION OF THE PRIOR ART

Hadjichristos (US 2004/0219891) describes a solution in which an adjacent channel power ratio (ACPR) is measured and a delay difference between a P-path and an A-path is iteratively tuned by controlling an adjustable delay element. Measuring the ACPR does not, however, give any indication if the delay on the A-path is too long compared to a delay on the P-path or vice versa. In other words, when the measurement gives a certain ACPR value there is no information if a delay generated with the adjustable delay element is too small or too long. The ACPR value as an indicator of delay mismatch does not provide guidance if the delay generated with the adjustable delay element should be increased or decreased. Therefore, an optimal setting for the adjustable delay element has to be searched by a trial and error method. This makes the tuning of the delay slow and inaccurate.

Biedka et al. (US 2004/0247041) propose methods to realize an adjustable delay element with sub-sample resolution. This publication does not, however, include any method for establishing what a delay difference between an A-path and a P-path is, and when said delay difference is optimized.

Vepsalainen et al. (US 2005/0069026) propose that a receiver unit of a transceiver is used to measure bit error rate (BER). A range of different delay values accomplished with adjustable delay elements are swept and measured BER values corresponding to different delay values are stored. A delay value that gives a smallest BER value is then selected. This kind of extensive search for finding optimal positions for the adjustable delay elements is, however, a quite slow method. The BER value as an indicator of delay mismatch does not provide guidance if the delay generated with an adjustable delay element should be increased or decreased.

BRIEF DESCRIPTION OF THE INVENTION

It is an objective of the present invention to provide a measurement arrangement for measuring an indicator of delay mismatch so that the above-mentioned limitations and drawbacks associated with prior art are eliminated or reduced. It is also an object of the present invention to provide a mobile communication device in which the above-mentioned limitations and drawbacks associated with the prior art are eliminated or reduced. It is also an object of the present invention to provide a set of integrated circuits (chip-set) that can be used in a polar transmitter so that the limitations and drawbacks associated with prior art are eliminated or reduced. It is also an object of the present invention to provide a measurement method for measuring an indicator of delay mismatch so that the limitations and drawbacks associated with prior art are eliminated or reduced.

The present invention is based on an observed behaviour of modulation side bands when polar modulation is performed using a base-band amplitude signal and a base-band phase signal that both have substantially sinusoidal alternating components with equal frequencies. Therefore, both amplitude information and phase information at respective input terminals of an amplitude modulator of a polar modulator have substantially sinusoidal alternating components. In this document the term "alternating component" means a remaining portion of a signal when a time average of said signal is subtracted from said signal.

When this kind of a base-band amplitude signal and a base-band phase signal are applied to a polar modulator, such a spectrum of a polar modulated signal is obtained that a difference between power represented by an upper side band of the spectrum and power represented by a lower side band of the spectrum is a function of a phase shift between the alternating components of said amplitude information and said phase information. When there is no phase shift the powers represented by the upper and lower side bands, respectively, are substantially equal and the spectrum is symmetrical around a center frequency.

In practice it is not possible to create an ideal sinusoidal signal. In this document the term "substantially sinusoidal" means such a time periodic waveform that the above-presented behaviour of modulation side bands is obtainable. Different waveforms can be tested with simulations and/or with measurement tests to find out if they can be used for obtaining the above-presented behaviour of the modulation side bands, i.e. to find out if they are close enough to a sinusoid.

The objectives of the present invention are achieved by utilizing information that is given by the above-described behaviour of the modulation side bands. This information can be used for obtaining a sign of a prevailing delay difference between an A-path and a P-path. Said sign indicates if a delay on the A-path is greater or smaller than that on the P-path. Furthermore, said information can be used for obtaining an estimate for a value of the prevailing delay difference.

The invention yields appreciable benefits compared to prior art solutions:

search time needed for finding optimal or sufficiently good settings for adjustable delay elements of a polar modulator is reduced, search can be performed in a non-iterative way, i.e. said search time can be made deterministic since an estimate of prevailing delay mismatch can be provided, and cost savings are achieved since time needed for testing and tuning polar transmitters is reduced due to the above-mentioned reasons.

As a first aspect of the invention a measurement arrangement for measuring an indicator of delay mismatch is provided, said delay mismatch being a difference between a propagation delay on an amplitude information path of a polar modulator and a propagation delay on a phase information path of the polar modulator. The measurement arrangement is characterized in that it comprises:

a signal generator disposed to feed a first measurement signal having a substantially sinusoidal alternating component into the amplitude information path of the polar modulator and to feed a second measurement signal having a substantially sinusoidal alternating component into the phase information path of the polar modulator, the alternating component of said first measurement signal and the alternating component of said second measurement signal having the same frequency, and a measurement circuitry disposed to measure said indicator as a quantity proportional to a difference between power represented by a lower side band of a spectrum of an output signal of the polar modulator and power represented by an upper side band of said spectrum.

As a second aspect of the invention a mobile communication device having a polar modulator is provided. The mobile communication device is characterized in that it comprises:

a signal generator disposed to feed a first measurement signal having a substantially sinusoidal alternating component into an amplitude information path of the polar modulator and to feed a second measurement signal having a substantially sinusoidal alternating component into a phase information path of the polar modulator, the alternating component of said first measurement signal and the alternating component of said second measurement signal having same frequency, a measurement circuitry disposed to measure an indicator of delay mismatch as a quantity proportional to a difference between power represented by a lower side band of a spectrum of an output signal of the polar modulator and power represented by an upper side band of said spectrum, said delay mismatch being a difference between a propagation delay on the amplitude information path of the polar modulator and a propagation delay on the phase information path of the polar modulator, and an adjustable delay module disposed to produce an adjustable delay on at least one of the following: the amplitude information path of the polar modulator and the phase information path of the polar modulator.

As a third aspect of the invention a set of integrated circuits for measuring an indicator of delay mismatch is provided, said delay mismatch being a difference between a propagation delay on an amplitude information path of a polar modulator and a propagation delay on a phase information path of the polar modulator. The set of integrated circuits is characterized in that it comprises the following elements in one or more integrated circuit:

a signal generator disposed to feed a first measurement signal having a substantially sinusoidal alternating component into the amplitude information path of the polar modulator and to feed a second measurement signal having a substantially sinusoidal alternating component into the phase information path of the polar modulator, the alternating component of said first measurement signal and the alternating component of said second measurement signal having same frequency, and a measurement circuitry disposed to measure said indicator as a quantity proportional to a difference between power represented by a lower side band of a spectrum of an output signal of the polar modulator and power represented by an upper side band of said spectrum.

As a fourth aspect of the invention a measurement method for measuring an indicator of delay mismatch is provided, said delay mismatch being a difference between a propagation delay on an amplitude information path of a polar modulator and a propagation delay on a phase information path of the polar modulator. The measurement method is characterized in that it comprises:

feeding a first measurement signal having a substantially sinusoidal alternating component into the amplitude information path of the polar modulator, feeding a second measurement signal having a substantially sinusoidal alternating component into the phase information path of the polar modulator so that the alternating component of said first measurement signal and the alternating component of said second measurement signal have same frequency, and measuring said indicator as a quantity proportional to a difference between power represented by a lower side band of a spectrum of an output signal of the polar modulator and power represented by an upper side band of said spectrum.

Features of various advantageous embodiments of the invention are described below.

The exemplary embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The invention and its other advantages are explained in greater detail below with reference to the preferred embodiments presented in the sense of examples and with reference to the accompanying drawings, in which.

DETAILED DESCRIPTION OF THE PREFERRED EMBODIMENTS OF THE INVENTION

Figure 1:
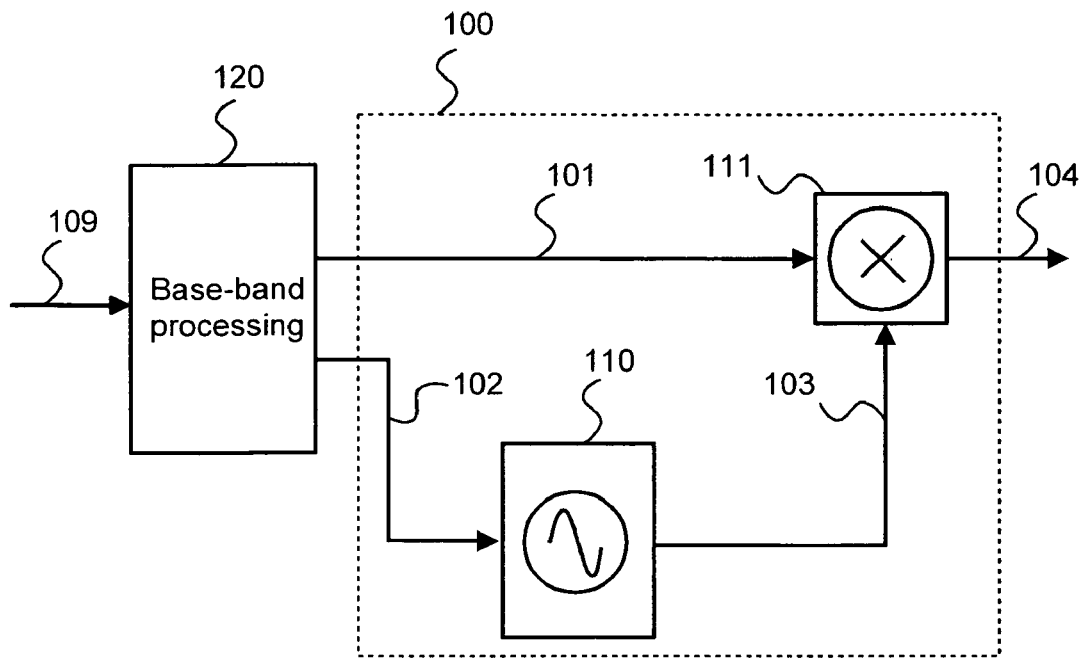
FIG. 1 shows a generic concept for a polar modulator according to prior art.
Figure 2:
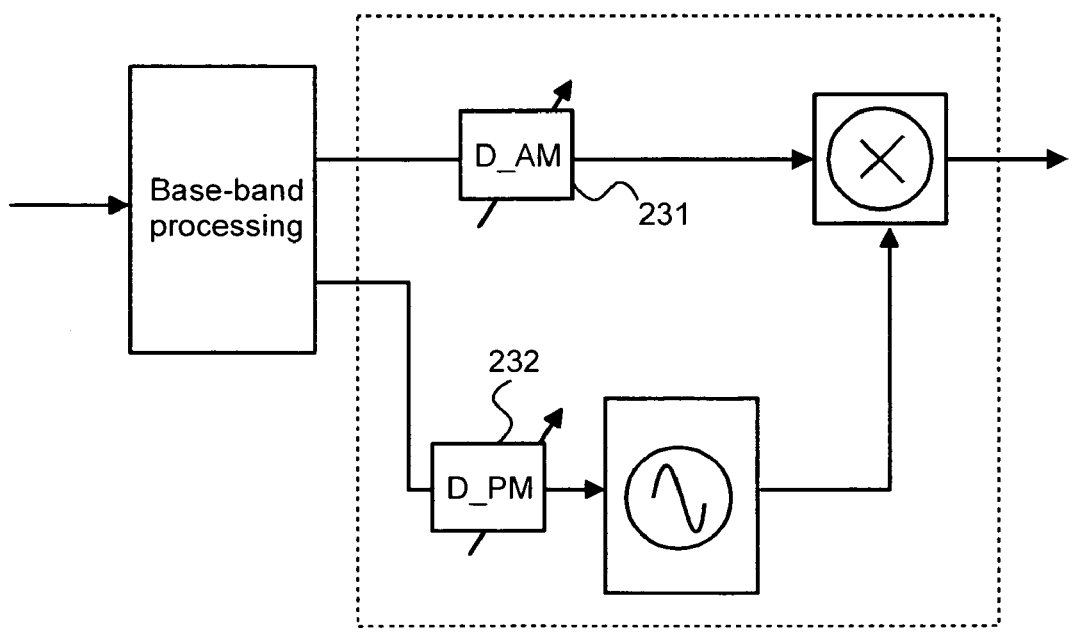
FIG. 2 shows block diagram of a polar modulator according to prior art.

FIGS. 1 and 2 have been explained above in the description of the prior art.

Figure 3:
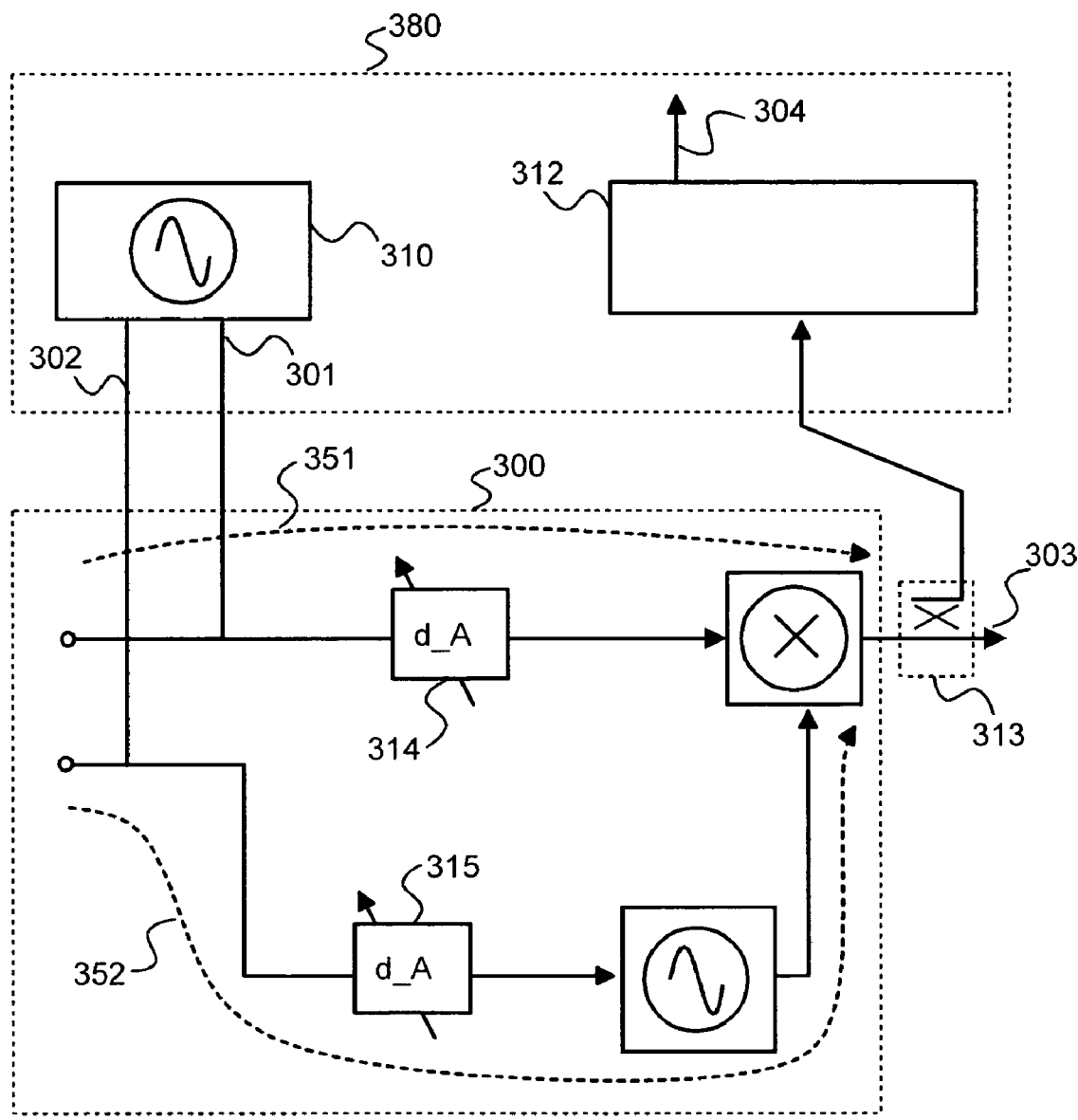
FIG. 3 shows a high-level block diagram of a measurement arrangement according to an embodiment of the invention and a polar modulator coupled to the measurement arrangement.

FIG. 3 shows a high level block diagram of a measurement arrangement according to an embodiment of the invention and a polar modulator 300 coupled to the measurement arrangement. The measurement arrangement 380 comprises a signal generator 310 disposed to feed a first measurement signal 301 having a substantially sinusoidal alternating component into an amplitude information path 351 (A-path) of the polar modulator 300 and to feed a second measurement signal 302 having a substantially sinusoidal alternating component into a phase information path 352 (P-path) of the polar modulator, the alternating component of said first measurement signal and the alternating component of said second measurement signal having same frequency. The measurement arrangement 380 comprises a measurement circuitry 312 disposed to measure an indicator of delay mismatch 304. Said indicator 304 is a quantity that is proportional to a difference between power represented by an upper side band of a spectrum of an polar modulated signal 303 and power represented by a lower side band of said spectrum. In this embodiment of the invention the polar modulated signal 303 is coupled to the measurement circuitry 312 with the aid of a directional coupler 313. It is also possible to use a switch that provides a galvanic connection from an output terminal of the polar modulator to the measurement circuitry 312. The polar modulator 300 is equipped with adjustable delay elements 314 and 315 that can be used for adjusting a delay mismatch between the A-path and the P-path.

The first and the second measurement signals 301 and 302 as functions of time can be modelled with the following equations:

$$m1(t)=A1+A2\sin(2\pi f_m t+\Phi1)+H1(t), \text{ and}$$

$$m2(t)=P1+P2\sin(2\pi f_m t+\Phi2)+H2(t), \quad (3)$$

where:

m1(t) and m2(t) denote values of the first and the second measurement signal at a time instant t, respectively, A1 and P1 are offset values of the first and the second measurement signal, respectively, A2 and P2 are amplitudes of the fundamental waves of the alternating components of the first and the second measurement signal, respectively, $\Phi1$ and $\Phi2$ are phases of the fundamental waves of the alternating components of the first and the second measurement signal, respectively, $f_m$ is frequency of the alternating components of the first and the second measurement signal, hereinafter $f_m$ is called a measurement frequency, and H1(t) and H2(t) represent harmonic contents of the alternating components of the first and the second measurement signal at a time instant t, respectively.

Existence of the harmonic contents H1(t) and H2(t) causes that the alternating components of the first and the second measurement signals are not purely sinusoidal. In this document simplified theoretical considerations are presented in order to illustrate principles of different embodiments of the invention. For the sake of illustrative purposes only fundamental waves of the alternating components of the first and the second measurement signals are considered, i.e. A2 sin (2$\pi f_m$ t+$\Phi1$) and P2 sin(2$\pi f_m$ t+$\Phi2$). In practical implementations the harmonic contents are, however, always present. It should be noted that the alternating components of the first and the second measurement signals may differ quite strongly from an ideal sinusoidal waveform when waveforms of said alternating components are displayed e.g. on a screen of an oscilloscope. In embodiments of the present invention a criteria when a certain time periodic waveform is sufficiently close to a sinusoid is, however, a fact whether the waveform produces such a spectrum of a polar modulated signal that a quantity that is proportional to a difference between power represented by a lower side band of the spectrum and power represented by an upper side band of the spectrum constitutes an indicator for a phase shift between amplitude and phase information in the polar modulated signal.

The polar modulated signal 303 as a function of time can be modelled with the following equation:

$$P(t)=\alpha m1(t-d1)*\sin(2\pi f_c t+\beta m2(t-d2)+\phi), \quad (4)$$

where $\alpha$, $\beta$, and $\phi$ are constants, $f_c$ is a center frequency of polar modulation, d1 is a propagation delay on the A-path, and d2 is a propagation delay on the P-path. Without loosing generality we can set $\alpha=\beta=1$ and $\phi=0$. A phase difference D between phase and amplitude information in the polar modulated signal is:

$$D=(\Phi2-2\pi f_m d2)-(\Phi1-2\pi f_m d1)=2\pi f_m \Delta d+\Delta\Phi, \quad (5)$$

where $\Delta d$ is a delay mismatch between the A-path and the P-path, i.e. d1−d2, and $\Delta\Phi$ is a phase shift between the alternating components of the first and the second measurement signal, i.e. $\Phi2-\Phi1$. In an optimal situation the adjustable delay elements 314 and 315 have been adjusted in a way that an absolute value of $\Delta d$ is minimized.

With laboratory measurements, simulations or by applying the Fourier transform to equation (4) it can be observed that the spectrum of the polar modulated signal 303 is a line spectrum having spectrum peaks at frequencies:

$$f_c+N\times f_m, \quad (6)$$

where N is an integer ( . . . , −2, −1, 0, 1, 2, 3, . . . ). Spectrum peaks at frequencies<$f_c$ (N<0) constitute a lower side band of the spectrum and spectrum peaks at frequencies>$f_c$ (N>0) constitute an upper side band of the spectrum. With laboratory measurements, simulations or by applying the Fourier transform to equation (4) the following properties of the spectrum can be observed:

1) power represented by the lower side band of said spectrum minus power represented by the upper side band of said spectrum is a periodic function of the phase difference D, 2) a period of said periodic function is 2$\pi$ in terms of the phase difference D (and 1/$f_m$ in terms of time), 3) said periodic function is substantially zero, i.e. the spectrum is symmetrical around $f_c$, when the phase difference D is n$\pi$, where n is an integer ( . . . , −2, −1, 0, 1, 2, 3, . . . ), and 4) said periodic function is positive when D belong to a range 2n$\pi$ . . . (2n+1)$\pi$ and negative when D belongs to a range (2n+1)$\pi$ . . . (2n+2)$\pi$.

Figure 4A:
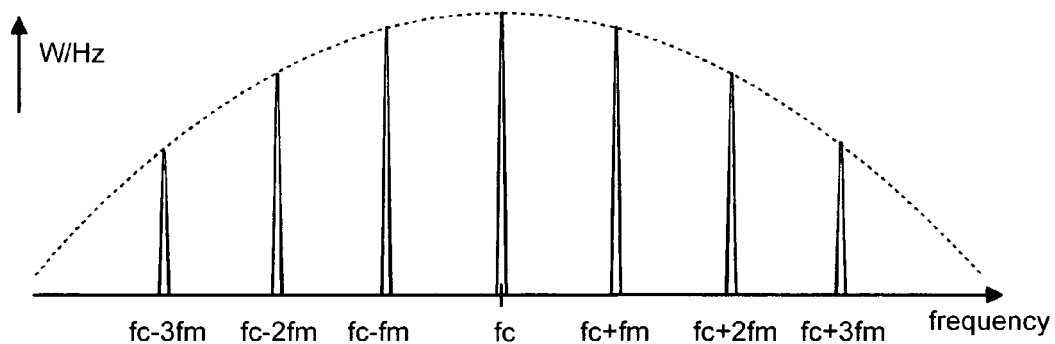
FIGS. 4a, 4b and 4c show spectrums of a polar modulated signal when both amplitude and phase information have substantially sinusoidal alternating components in a measurement arrangement according to an embodiment of the invention.
Figure 4B:
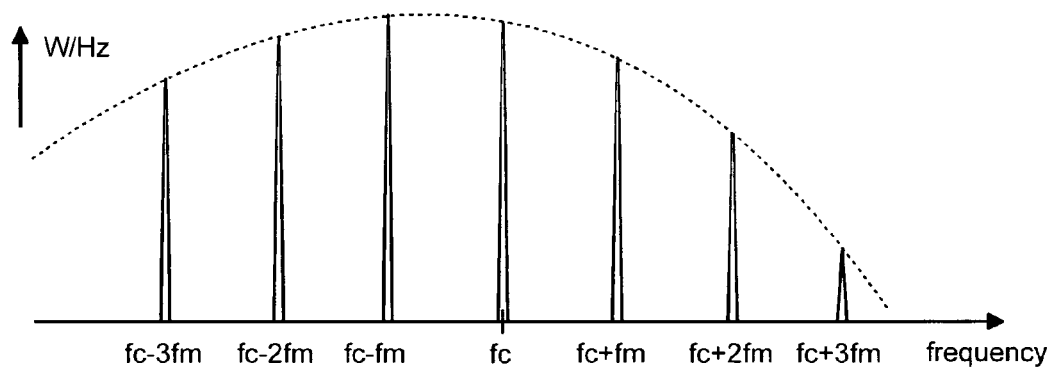
Figure 4C:
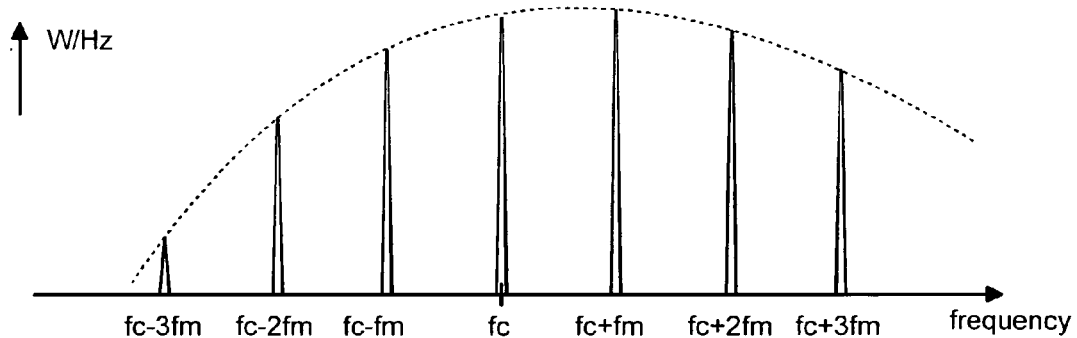

The spectrum corresponding with a situation in which D is zero (or n$\pi$) is illustrated in FIG. 4a, the spectrum corresponding with a situation in which D belongs to a range 2n$\pi$ . . . (2n+1)$\pi$ is illustrated in FIG. 4b, and the spectrum corresponding with a situation in which D belongs to a range (2n+1)$\pi$ . . . (2n+2)$\pi$ is illustrated in FIG. 4c.

Principles for constructing the measurement circuitry 312 disposed to measure the indicator 304 are described below with the aid of FIGS. 5, 6a, 6b, and 7.

Figure 5:
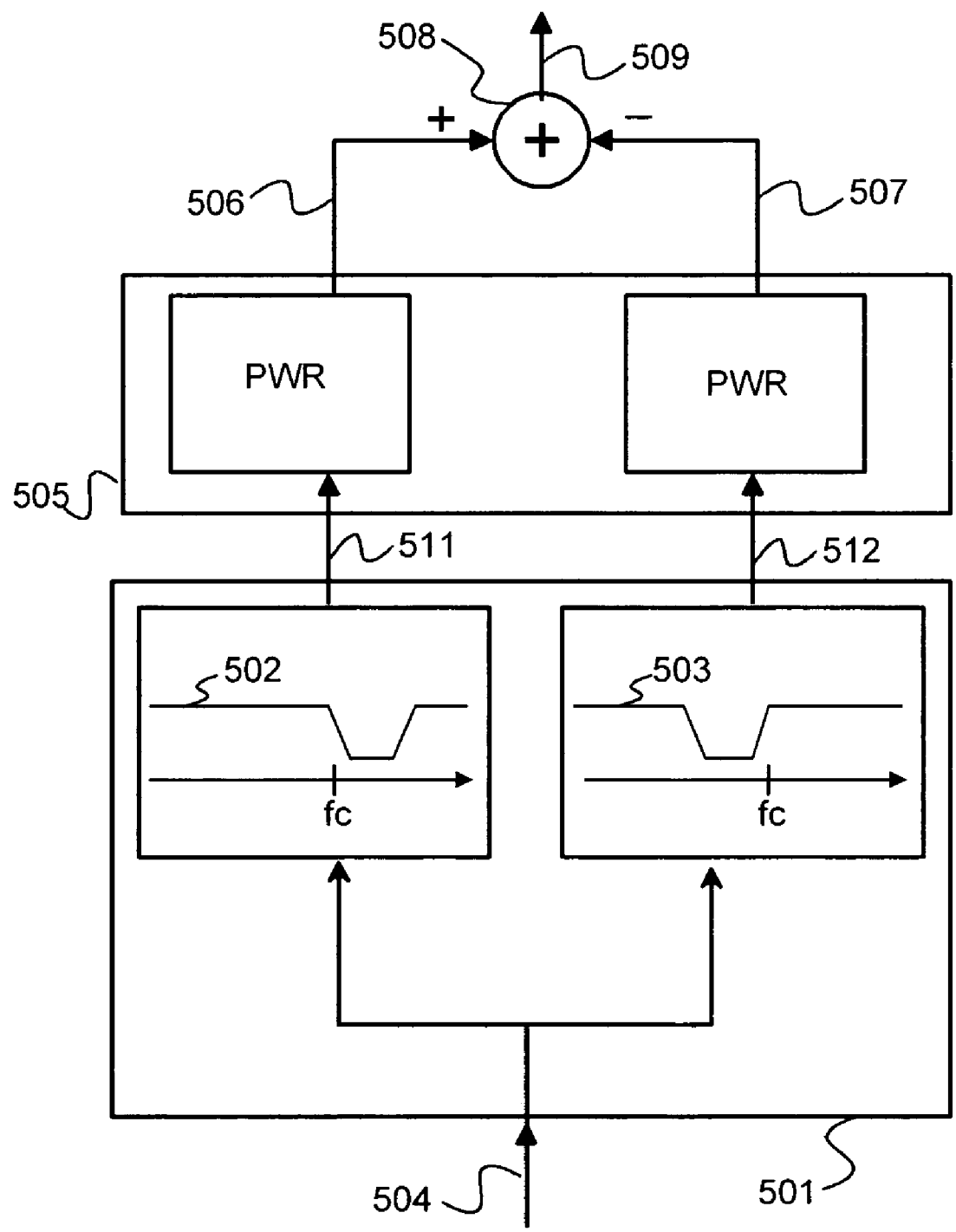
FIG. 5 shows a block diagram of a measurement circuitry used in a measurement arrangement according to an embodiment of the invention.

FIG. 5 shows a block diagram of a measurement circuitry that is used in a measurement arrangement according to an embodiment of the invention. The measurement circuitry shown in FIG. 5 comprise:

a filter unit 501 that is able to form a first amplitude response 502 that is more suppressive on the upper side band than on the lower side band and a second amplitude response 503 that is more suppressive on the lower side band than on the upper side band, said filter unit is arranged to filter a waveform of a polar modulated signal 504, a detector unit 505 disposed to measure a first level value 506 from a signal 511 produced with the filter unit using the first amplitude response and a second level value 507 from a signal 512 produced with the filter unit using the second amplitude response, and a subtraction element 508 disposed to produce an indicator of delay mismatch 509 as a difference between the first level value 506 and the second level value 507.

The above-mentioned first level value 506 is a quantity that is proportional to power of the signal 511 and, correspondingly, the second level value 507 is a quantity that is proportional to power of the signal 512. In the remainder of this document a term "level value" means a quantity that is proportional to power, i.e. when power is increased/decreased also a level value is increased/decreased. A level value is not necessarily, however, proportional to power in a linear manner.

The measurement circuitry shown in FIG. 5 can be used as the measurement circuitry represented with a block 312 in the high-level block diagram shown in FIG. 3. In that case the signal 504 in FIG. 5 corresponds with the signal 303 in FIG. 3 and the indicator 509 in FIG. 5 corresponds with the indicator 304 in FIG. 3.

Operation of the measurement circuitry shown in FIG. 5 is analyzed below. The first and the second amplitude responses 502 and 503 are designed to be symmetrical in way that the first amplitude response 502 attenuates a spectrum peak at a frequency $f_c + kf_m$ in a same way as the second amplitude response 503 attenuates a spectrum peak at a frequency $f_c - kf_m$, where k is an integer.

Figure 6A:
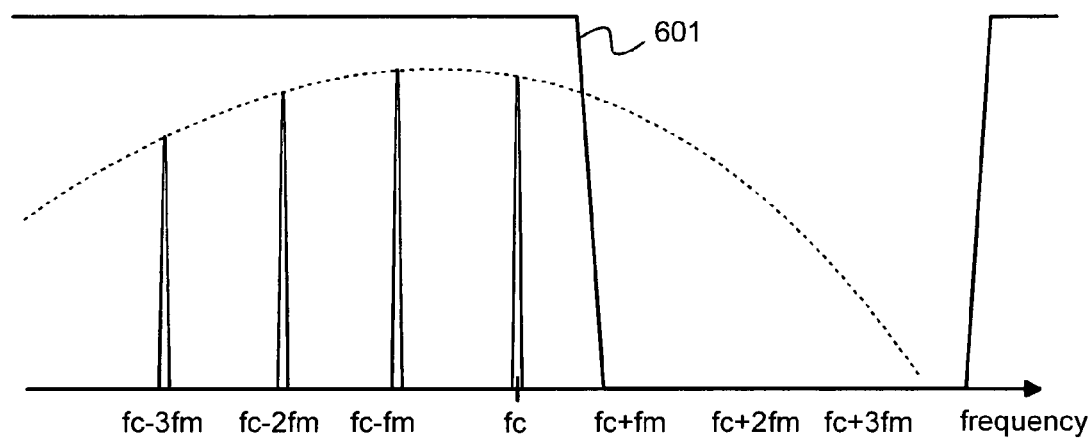
FIGS. 6a and 6b illustrate filtering operations associated with a measurement circuitry in a measurement arrangement according to an embodiment of the invention.
Figure 6B:
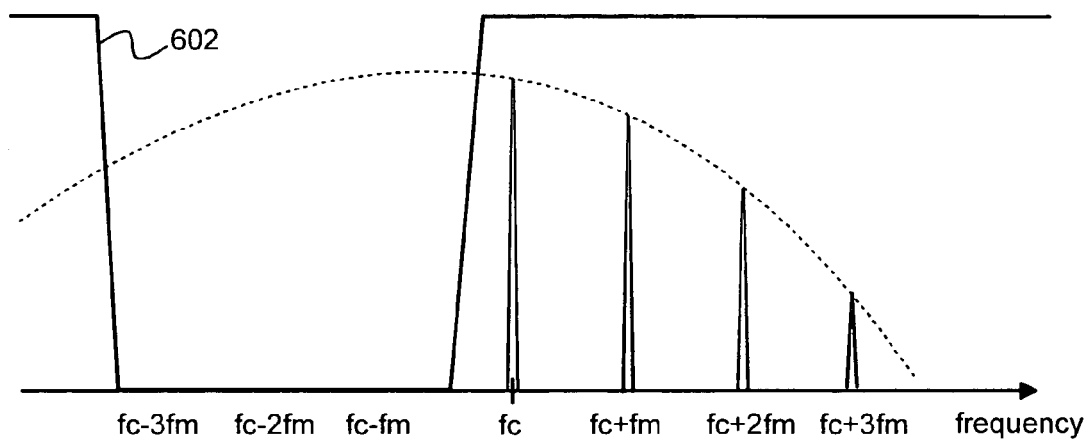

Powers of the filtered signals 511 and 512 are mutually equal when the spectrum of the polar modulated signal 504 is symmetrical around a center frequency $f_c$, i.e. when the above-described phase difference D is $n\pi$ (n is an integer). Power loss due to attenuation caused by the first amplitude response 502 is smaller than corresponding power loss caused by the second amplitude response 503 when power represented by the lower side band is greater than power represented by the upper side band and vice versa. The above-mentioned phenomenon is illustrated in FIGS. 6a and 6b that correspond with a situation in which the power represented by the lower side band is greater than the power represented by the upper side band. In FIG. 6a the first amplitude response 601 cuts off spectrum peaks at frequencies $f_c + f_m$, $f_c + 2f_m$, and $f_c + 3f_m$. In FIG. 6b the second amplitude response 601 cuts off spectrum peaks at frequencies $f_c - f_m$, $f_c - 2f_m$, and $f_c - 3f_m$. Power represented by the remaining spectrum peaks is higher in FIG. 6a than that in FIG. 6b. Therefore, a power difference between the filtered signals 511 and 512 is an indicator for a difference between the power represented by the lower side band and the power represented by the upper side band. The power difference between the filtered signals 511 and 512 is in turn proportional to the indicator 509 that is the difference between the first level value 506 and the second level value 507.

Exemplary designs for the first and the second amplitude responses are such that the first amplitude response has transfer nulls at frequencies $f_c + kf_m$, where k=1, 2, ..., N, and the second amplitude response has transfer nulls at frequencies $f_c - kf_m$. The level values 506 and 507 can be measured with a detector according to prior art that is able to produce a quantity that is proportional to power of a signal that is comprised of a plurality of sinusoids having different frequencies. In this case the signals 511 and 512 are comprised of sinusoids represented by the spectrum peaks. A detector can be constructed e.g. with a mixer that forms a squared signal and a low-pass filter that forms an average of said squared signal. This kind of detector produces a quantity that is linearly proportional to said power.

In some cases the level values 506 and 507 can be measured with a simple envelope detector. An envelope detector is sufficient e.g. when the first amplitude response 502 passes only one spectrum peak of the lower side band and the second amplitude response 503 passes only one spectrum peak of the upper side band because in this kind of situation each of the signals 511 and 512 is substantially composed of only one sinusoid. With an envelope detector a quantity that is linearly proportional to amplitude of said sinusoid is obtained.

In an embodiment of the invention the filter unit 501 includes mechanisms to realize two parallel filters having the first and the second amplitude responses 502 and 503 and the detector unit 505 has two parallel detectors. In this case the level values 506 and 507 can be measured simultaneously. This kind of case is shown in FIG. 5.

In an alternative embodiment of the invention the filter unit 501 includes mechanisms to realize an adjustable filter that can be set to form either the first amplitude response or the second amplitude response. In this case the level values 506 and 507 are measured with successive measurements and only one detector is needed in the detector unit 505. A memory unit is needed for storing a first measured level value while measuring a second level value.

Figure 7:
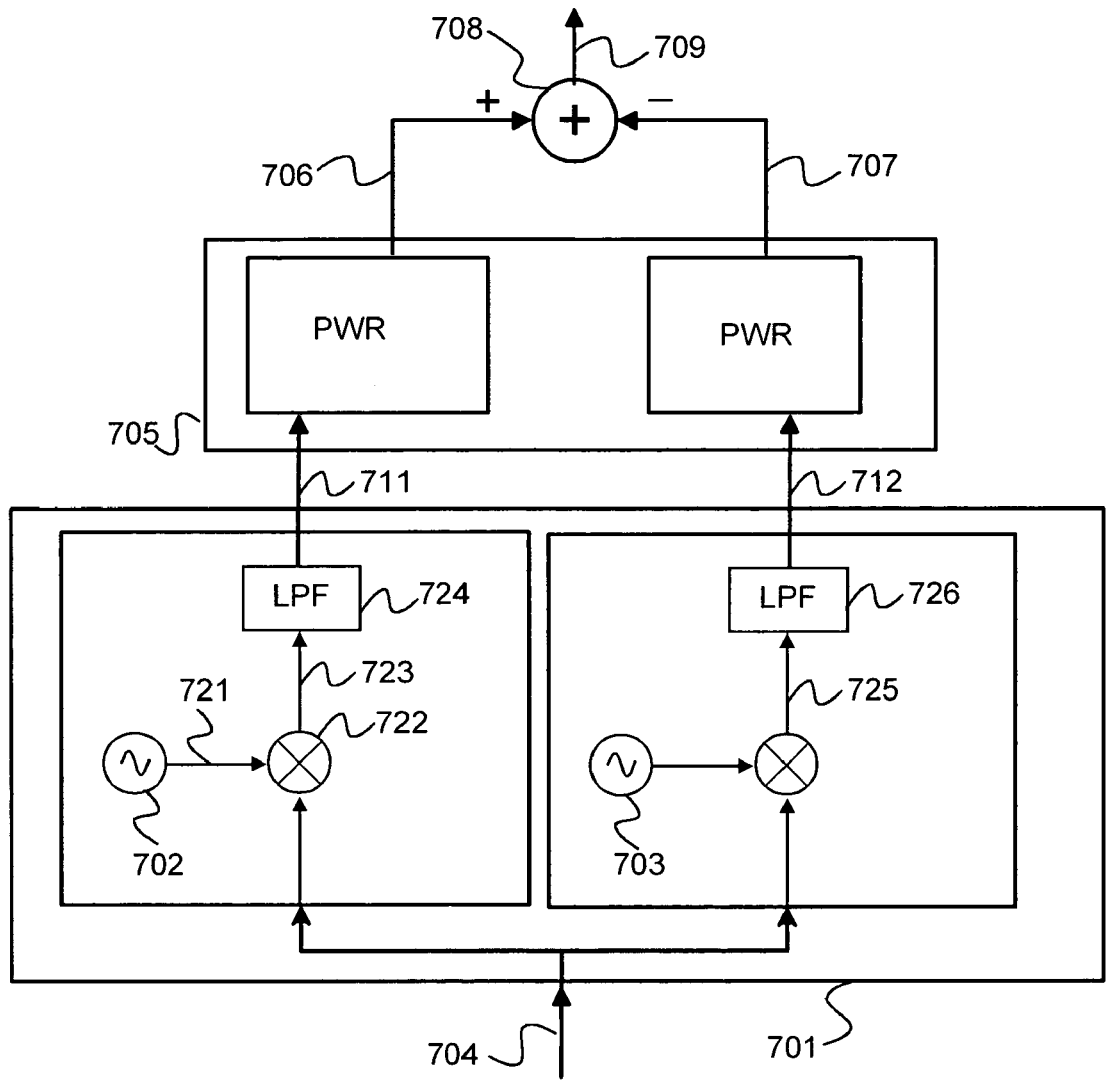
FIG. 7 shows a block diagram of a measurement circuitry used in a measurement arrangement according to an embodiment of the invention.

FIG. 7 shows a block diagram of a measurement circuitry that is used in a measurement arrangement according to an embodiment of the invention. The measurement circuitry shown in FIG. 7 comprise:

a down-modulation unit 701 that is able to perform down-modulation with a first down-modulation frequency 702 that is lower than a center frequency $f_c$ of a polar modulated signal 704 and to perform down-modulation with a second down-modulation frequency 703 that is higher than said center frequency, said down-modulation unit is arranged to down-modulate the waveform of the polar modulated signal 704, a detector unit 705 disposed to produce a first level value 706 from a signal 711 produced with the down-modulation unit using the first down-modulation frequency 702 and a second level value 707 from a signal 712 produced with the down-modulation unit using the second down-modulation frequency 703, and a subtraction element 708 disposed to produce an indicator of delay mismatch 709 as a difference between the first level value 706 and the second level value 707.

The measurement circuitry shown in FIG. 7 can be used as the measurement circuitry represented with the block 312 in the high-level block diagram shown in FIG. 3. In that case the signal 704 in FIG. 7 corresponds with the signal 303 in FIG. 3 and the indicator 709 in FIG. 7 corresponds with the indicator 304 in FIG. 3.

Operation of the measurement circuitry shown in FIG. 5 is analyzed below. The first and the second down-modulation frequencies 702 and 703 are designed to locate symmetrically around the center frequency in the frequency domain, i.e. the first down-modulation frequency is $f_c - F$ and the second down-modulation frequency is $f_c + F$, where F is a constant. The polar modulated signal is multiplied with a down-modulating signal 721 in a mixer 722. A spectrum of a mixed signal 723 is a line spectrum having spectrum peaks at sum and difference frequencies of the spectrum peaks of the polar modulated signal and of the down-modulating signal 721. Therefore, the mixed signal 723 has spectrum peaks at the following frequencies:

$f_c+N \times f_m \pm (f_c-F)$ for the first down-modulation frequency, and $f_c+N \times f_m \pm (f_c+F)$ for the second down-modulation frequency, (7)

where N is an integer (..., −2, −1, 0, 1, 2, 3, ...). For example, if we assume that $F=3.5\,f_m$ the four lowest frequency spectrum peaks of the mixed signal 723 have frequencies:

0.5 $f_m$ corresponding with the spectrum peaks of the polar modulated signal at $f_c-3f_m$ and $f_c-4f_m$, 1.5 $f_m$ corresponding with the spectrum peaks of the polar modulated signal at $f_c-2f_m$ and $f_c-5f_m$, 2.5 $f_m$ corresponding with the spectrum peaks of the polar modulated signal at $f_c-f_m$ and $f_c-6f_m$, and 3.5 $f_m$ corresponding with the spectrum peaks of the polar modulated signal at $f_c$ and $f_c-7f_m$.

In the analysis above no difference was made between negative and positive frequencies since cos(−x)=cos(x) and sin(−x)=−sin(x), x being a real number. The above-mentioned spectrum peaks of the mixed signal have contributions from only the lower side band and the center frequency of the polar modulated signal. The fifth spectrum peak of the mixed signal has frequency 4.5 $f_m$ and it corresponds also with an upper side band spectrum peak ($f_c+f_m$) of the polar modulated signal. The spectrum peaks of the mixed signal 723 that correspond also with the upper side band spectrum peaks are cut off with a low-pass filter 724. In the example case with $F=3.5\,f_m$ the low-pass filter 724 is designed to cut off spectrum peaks at and above 4.5 $f_m$. A corresponding analysis can be performed also for a mixed signal 725 that is obtained with the second down-modulating frequency $f_c+F$.

Power of the signal 711 is higher than power of signal 712 when power represented by the lower side band is greater than power represented by the upper side band and vice versa. Therefore, a power difference between the filtered signals 711 and 712 is an indicator for a difference between the power represented by the lower side band and the power represented by the upper side band. The power difference between the filtered signals 711 and 712 is in turn proportional to the indicator 709 that is the difference between the first level value 706 and the second level value 707.

The level values 706 and 707 can be measured with a detector according to prior art that is able to produce a quantity that is proportional to power of a signal that is comprised of a plurality of sinusoids having different frequencies. In this case the filtered signals 711 and 712 are comprised of sinusoids represented by spectrum peaks that are passed by the low-pass filter 724 and by a low-pass filter 726, respectively. A detector can be constructed e.g. with a mixer that forms a squared signal and a low-pass filter that forms an average of said squared signal. This kind of detector produces a quantity that is linearly proportional to said power.

In some cases the level values 706 and 707 can be measured with a simple envelope detector. An envelope detector is sufficient when each of the filtered signals 711 and 712 is comprised of only one sinusoid. In this case a quantity that is linearly proportional to amplitude of said sinusoid is obtained.

Filtered signals 711 and 712 such that each of them has a contribution from only one spectrum peak (say $f_c-kf_m$, $f_c+kf_m$) of the polar modulated signal can be obtained in the following way. The frequencies of the first down modulating signal and the second down-modulating signal are chosen to be e.g. $f_c-(k-¼)f_m$ and $f_c+(k-¼)f_m$, respectively, and the low-pass filters 724 and 726 are designed to cut off spectrum peaks having frequency higher than $f_m/2$. It should be noted that the system shown in FIG. 7 does not work if the down-modulation frequencies co-inside with frequencies of the spectrum peaks of the polar modulated signal since a dc-component of a product of two sinusoids having equal frequencies depends not only on amplitudes of said sinusoids but also on a phase difference between said sinusoids. This problem can be circumvented with a complex valued down-modulation that uses two down-modulating sinusoids with a ninety degrees mutual phase shift, i.e. in-phase and quadrature sinusoids. This kind of down-modulation that uses the in-phase and quadrature sinusoids is a well-known concept for a person skilled to art.

In an embodiment of the invention the down-modulation unit 701 includes mechanisms to realize two parallel down-modulators and the detector unit 705 has two parallel detectors. In this case the level values 706 and 707 can be measured simultaneously. This kind of case is shown in FIG. 7.

In an alternative embodiment of the invention the down-modulation unit 701 includes mechanisms to produce a down-modulating signal that can be set to have either the first down-modulation frequency or the second down-modulation frequency. In this case the level values 706 and 707 are measured with successive measurements and only one detector is needed in the detector unit 705. A memory unit is needed for storing a first measured level value while measuring a second level value.

In an embodiment of the invention the block 312 in FIG. 3 representing the measurement circuitry is a spectrum analyzer a signal input of which is fed with the polar modulated signal 303. An indicator of delay mismatch can be obtained by visual inspection from a display screen of the spectrum analyzer or by using probe functions that may be available in the spectrum analyzer.

Figure 8A:
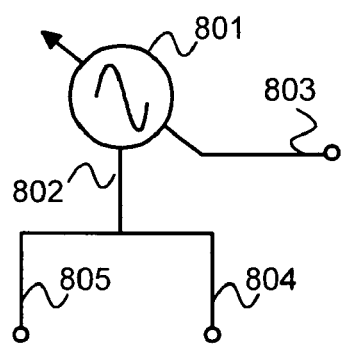
FIGS. 8a, 8b, 8c, and 8d show a block diagrams of signal generators used in measurement arrangements according to embodiments of the invention.

FIG. 8a shows a block diagram of a signal generator that is used in a measurement arrangement according to an embodiment of the invention. The signal generator is a controllable oscillator 801 that produces a sinusoidal output signal 802 frequency of which can be controlled with a control parameter 803. The output signal 802 constitutes a first measurement signal 804 and a second measurement signal 805. This kind of simple signal generator can be used when there is no need to adjust a mutual phase shift between the first and the second measurement signal, there is no need to adjust amplitudes of said measurement signals, and there is no need to have offsets in said measurement signals. This is a case e.g. when a polar modulator under test comprises adjustable gains and offset adjusting means in its A-path and/or P-path.

The signal generator shown in FIG. 8a can be used as the signal generator represented with a block 310 in the high-level block diagram shown in FIG. 3. In that case the first measurement signal 804 in FIG. 8a corresponds with the first measurement signal 301 in FIG. 3 and the second measurement signal 805 in FIG. 8a corresponds with the second measurement signal 302 in FIG. 3.

Figure 8B:
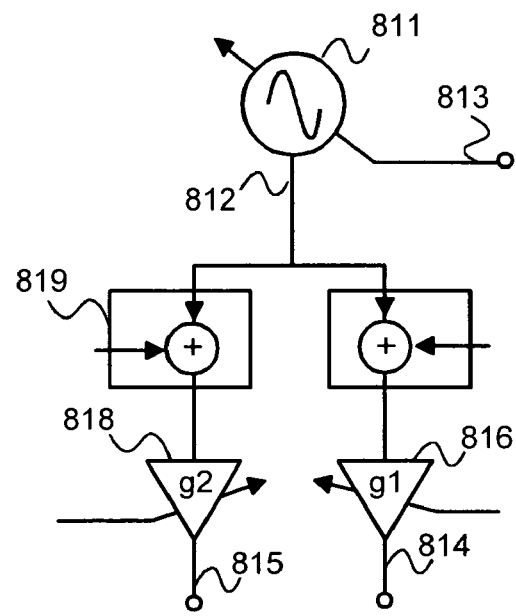

FIG. 8b shows a block diagram of a signal generator that is used in a measurement arrangement according to an embodiment of the invention. The signal generator comprises a controllable oscillator 811 that produces a sinusoidal output signal 812 frequency of which can be controlled with a control parameter 813. The signal generator comprises two controllable offset units 819 and 818 that are used for adding desired DC-offsets to the output signal 812 of the oscillator. The signal generator comprises two controllable gain units 816 and 818 that are used for adjusting levels of a first measurement signal 814 and the second measurement signal 815, respectively. With certain polar modulators it is needed that the first measurement signal 814 that is fed into an A-path has such a DC-offset that a value of the first measurement signal does not change its sign, i.e. the first measurement signal 814 has a constant polarity. It may be as well needed that the second measurement signal 815 that is fed into a P-path has such a DC-offset that a value of the second measurement signal does not change its sign, i.e. the second measurement signal 815 has a constant polarity.

The signal generator shown in FIG. 8*b* can be used as the signal generator represented with the block 310 in the high-level block diagram shown in FIG. 3. In that case the first measurement signal 814 in FIG. 8*b* corresponds with the first measurement signal 301 in FIG. 3 and the second measurement signal 815 in FIG. 8*b* corresponds with the second measurement signal 302 in FIG. 3.

Figure 8C:
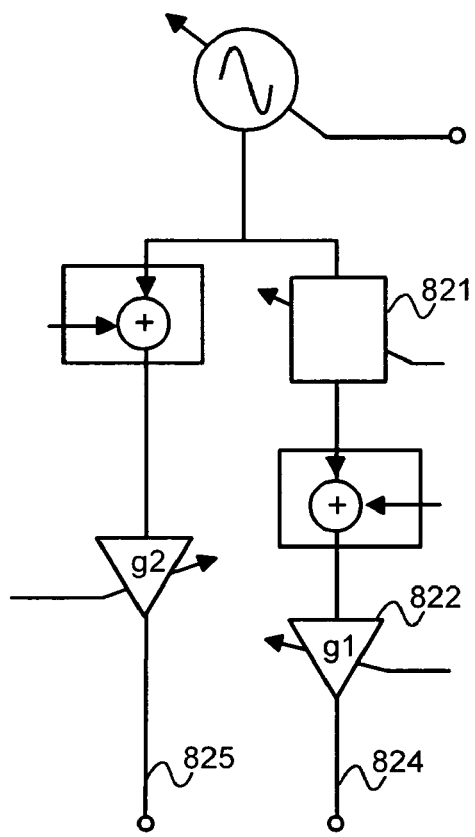

FIG. 8*c* shows a block diagram of a signal generator that is used in a measurement arrangement according to an embodiment of the invention. The signal generator comprises a controllable phase shifter 821 that can be used for producing a pre-determined phase shift between an alternating component of a first measurement signal 824 and an alternating component of a second measurement signal 825. The controllable phase shifter 821 can be for example an adjustable filter a phase response of which can be adjusted. Adjusting the phase response causes usually an unwanted change in an amplitude response but the change in the amplitude response can be compensated with a controllable gain unit 822. The signal generator shown in FIG. 8*c* can be used as the signal generator represented with the block 310 in the high-level block diagram shown in FIG. 3. In that case the first measurement signal 824 in FIG. 8*c* corresponds with the first measurement signal 301 in FIG. 3 and the second measurement signal 825 in FIG. 8*c* corresponds with the second measurement signal 302 in FIG. 3.

Figure 8D:
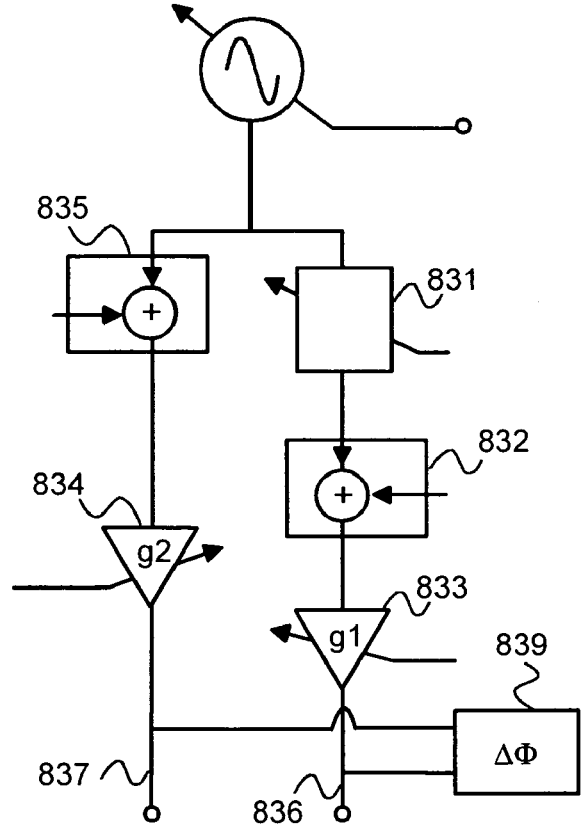

FIG. 8*d* shows a block diagram of a signal generator that is used in a measurement arrangement according to an embodiment of the invention. The signal generator comprises a phase detector 839 disposed to detect a phase shift between an alternating component of a first measurement signal 836 and an alternating component of a second measurement signal 837. The phase detector is needed when one or more of controllable gain units 833 and 834, controllable offset units 832 and 835, and a controllable phase shifter 821 produces a phase shift a value of which is not known accurately enough, i.e. the phase shift has a too big range of uncertainty. The signal generator shown in FIG. 8*d* can be used as the signal generator represented with the block 310 in the high-level block diagram shown in FIG. 3. In that case the first measurement signal 836 in FIG. 8*d* corresponds with the first measurement signal 301 in FIG. 3 and the second measurement signal 837 in FIG. 8*d* corresponds with the second measurement signal 302 in FIG. 3.

Figure 9:
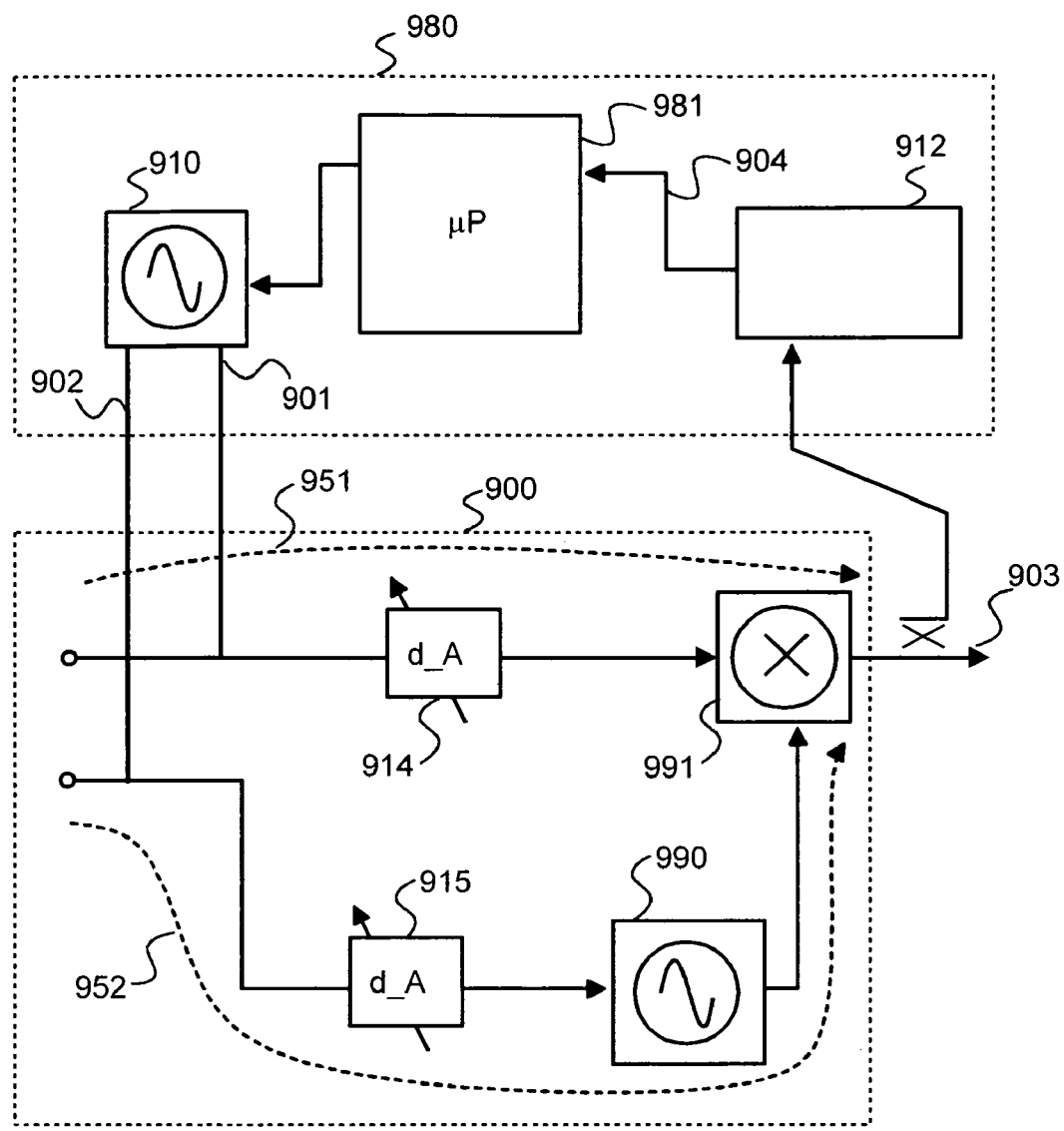
FIG. 9 shows a high level block diagram of a measurement arrangement according to an embodiment of the invention and a polar modulator coupled to the measurement arrangement.

FIG. 9 shows a high-level block diagram of a measurement arrangement according to an embodiment of the invention and a polar modulator 900 coupled to the measurement arrangement. The measurement arrangement 980 comprises a signal generator 910 disposed to feed a first measurement signal 901 having a substantially sinusoidal alternating component into an amplitude information path 951 (A-path) of the polar modulator 900 and to feed a second measurement signal 902 having a substantially sinusoidal alternating component into a phase information path 952 (P-path) of the polar modulator, the alternating component of said first measurement signal and the alternating component of said second measurement signal having same frequency $f_m$. The measurement arrangement 980 comprises a measurement circuitry 912 disposed to measure an indicator of delay mismatch 904. The measurement arrangement 980 comprises a processor 981 disposed to control measurements and to perform calculations needed in conjunction with the measurements. The polar modulator 900 is equipped with adjustable delay elements 914 and 915 that can be used for adjusting the delay mismatch between the A-path and the P-path.

In practice it is possible to determine a greatest possible delay mismatch Max$\Delta$d. Signal processing elements on the A-path 951 and on the P-path 952 can be analysed and greatest possible propagation delays for the A-path and for the P-path can be determined as sums of individual maximum propagation delays of the signal processing elements on the A-path and on the P-path, respectively. Correspondingly, smallest possible propagation delays for the A-path and for the P-path can be determined as sums of individual minimum propagation delays of the signal processing elements on the A-path and on the P-path, respectively. The greatest possible delay mismatch Max$\Delta$d can be calculated with the aid of said greatest and smallest possible propagation delays on the A-path and on the P-path. The A-path and the P-path may include for example analog-to-digital converters, filters and delta-sigma modulators in addition to a phase modulator 990, an amplitude modulator 991, and the adjustable delay elements 914 and 915.

The indicator 904 is periodic function of a phase difference D that was given in equation (5) and that is repeated here for the sake of convenience $$D=2\pi f_m(d1-d2)+(\Phi 2-\Phi 1)=2\pi f_m\Delta d+\Delta\Phi, \qquad (8)$$

where $f_m$ is measurement frequency, $\Delta$d is the delay mismatch between the A-path and the P-path, i.e. propagation delay on the A-path minus that of the P-path, and $\Delta\Phi$ is a phase shift between the measurement signals 901 and 902, i.e. a phase $\Phi 2$ of the alternating component of the second measurement signal 902 minus a phase $\Phi 1$ of the alternating component of the first measurement signal 901. When the alternating component of the second measurement signal leads that of the first measurement signal there is a same effect than in a case in which the propagation delay on the A-path is greater than that on the P-path.

Figure 10:
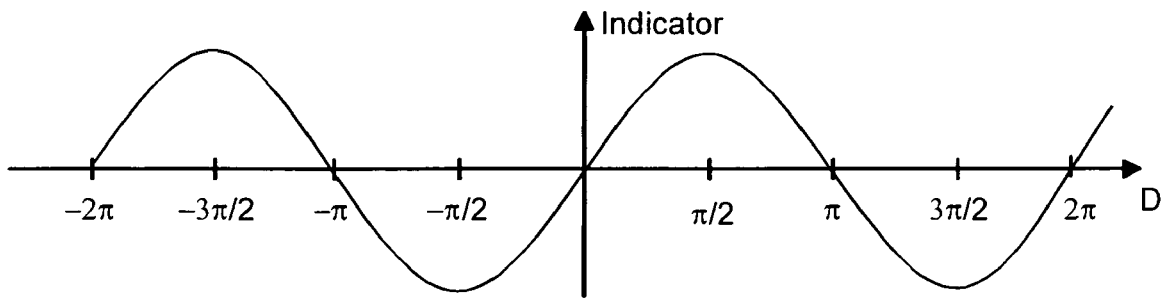
FIG. 10 shows an indicator of delay mismatch as a function of a phase shift between amplitude information and phase information in a polar modulated signal in a measurement arrangement according to an embodiment of the invention.

In this presentation the indicator 904 is defined to be a quantity that is proportional to power represented by a lower side band minus power represented by an upper side band. This definition is in line with the measurement circuitry shown in FIGS. 5 and 7. It should be noted that it is also possible to define the indicator 904 to be a quantity that is proportional to the power represented by the upper side band minus the power represented by the lower side band. A principled form of the indicator 904 as a function of D is illustrated in FIG. 10. A sign of the indicator 904 is also a sign of the phase shift D when D belongs to the range: $-\pi \ldots +\pi$.

From equation (8) we see that when D belongs to the above-mentioned range the delay mismatch $\Delta$d belongs to the range: $(-\pi-\Delta\Phi)/2\pi f_m \ldots (\pi-\Delta\Phi)/2\pi f_m$.

In order to guarantee that the sign of the indicator 904 is also the sign of the phase difference D the measurement frequency $f_m$ and the phase shift $\Delta\Phi$ have to be selected in a way that:

$$(-\pi-\Delta\Phi)/2\pi f_m < -\text{Max}\Delta d \text{ and } \text{Max}\Delta d < (\pi-\Delta\Phi)/2\pi f_m, \qquad (9)$$

where Max$\Delta$d is the greatest possible delay mismatch.

In a measurement arrangement according to an embodiment of the invention the processor 981 is disposed to compute a sign of the delay mismatch on the basis of the indicator 904. This is achieved by selecting the phase shift ΔΦ to be zero and by selecting the measurement frequency $f_m$ so that equation (9) is satisfied, i.e:

$$f_m < \frac{1}{2 \times \text{Max}\Delta d}. \tag{10}$$

With this kind of selection of the measurement frequency $f_m$ and the phase shift ΔΦ the sign of indicator 904 is same as the sign of the delay mismatch Δd.

In a measurement arrangement according to an embodiment of the invention the processor 981 is adapted control an adjustable portion of the delay mismatch. The adjustable portion of the delay mismatch is provided with the adjustable delay elements 914 and 915. The adjustable portion can also be provided with only one adjustable delay element on the A-path or on the P-path. In this case it has to be kept in mind that a negative delay cannot be realized and, therefore, there has to be a sufficient constant delay on a signal path (A- or P-path) that does not include an adjustable delay element. The processor 981 is adapted to search such a value for the adjustable portion of the delay mismatch that the delay mismatch Δd is minimized.

The measurement frequency $f_m$ is selected so that equation (10) is satisfied and the phase shift ΔΦ is set to zero. Optimal setting values for the adjustable delay element 914 and/or for the adjustable delay element 915 can be searched e.g. with the following search algorithm:

Start of the algorithm: Set a search step S to a pre-determined positive value, set a damping factor α to a pre-determined positive value smaller than one, and set a limit value ε to a pre-determined positive value, phase 1: measure the sign of the indicator 904 (positive or negative), i.e. the sign of the delay mismatch Δd, phase 2: if the indicator has changed its sign compared to a previously measured sign and S is greater or equal to the limit value ε multiply the search step S with the damping factor α, if the indicator has changed its sign and S is less than the limit value ε the search is complete (end of the algorithm), phase 3: If the indicator is positive adjust at least one of the adjustable delay elements 914 and 915 so that the delay mismatch Δd is decreased with S, if the indicator is negative adjust at least one of the adjustable delay elements so that the delay mismatch Δd is increased with S, go to phase 1.

When the search has been completed an absolute value of the delay mismatch Δd is less than the limit value ε, i.e. abs(Δd)<ε, where abs(•) means an absolute value.

In a measurement arrangement according to an embodiment of the invention the processor 981 is disposed determine on the basis of the indicator 904 if the delay mismatch Δd is greater or smaller than a known quantity $-\Delta/2\pi f_m$. The indicator gives a sign of D when equation (9) is satisfied. According to equation (8) D is positive when $\Delta d > -\Delta\Phi/2\pi f_m$ and negative when $\Delta d < -\Delta\Phi/2\pi f_m$.

In a measurement arrangement according to an embodiment of the invention the processor 981 is adapted to control the signal generator 910 and to search an estimate for the delay mismatch Δd by performing a plurality of measurements with a plurality of values of the phase shift ΔΦ. The processor 981 gives to the signal generator 910 the phases of the alternating components of the first and the second measurement signal as control parameters.

The measurement frequency $f_m$ and the phase shift ΔΦ are selected so that the sign of the indicator 904 is also the sign of the phase difference D, e.g. according to equation (9).

The estimate for the delay mismatch Δd can be found e.g. with the following search algorithm:

Start of the algorithm: Set a search step S to a pre-determined positive value, set a damping factor α to a pre-determined positive value smaller than one, and set a limit value ε to a pre-determined positive value, phase 1: measure the sign of the indicator 904, i.e. the sign of D $(=2\pi f_m \Delta d + \Delta\Phi)$, phase 2: if the indicator has changed its sign compared to a previously measured sign and S is greater or equal to the limit value ε multiply the search step S with the damping factor α, if the indicator has changed its sign and S is less the limit value ε the search is complete (end of the algorithm), phase 3: If the indicator is positive decrease ΔΦ with S, if the indicator is negative increase ΔΦ with S, go to phase 1.

When the search has been completed an absolute value of D is less than the limit value ε. Therefore, a distance between Δd and $-\Delta\Phi/2\pi f_m$ is less than $\epsilon/2\pi f_m$. The quantity $-\Delta\Phi/2\pi f_m$ constitutes the estimate for the delay mismatch Δd.

In a measurement arrangement according to an embodiment of the invention the processor 981 is disposed so that the signal generator 910 and the measurement circuitry 912 perform successive measurements to produce a plurality of indicators corresponding with a plurality of values of the measurement frequency $f_m$.

Figure 11:
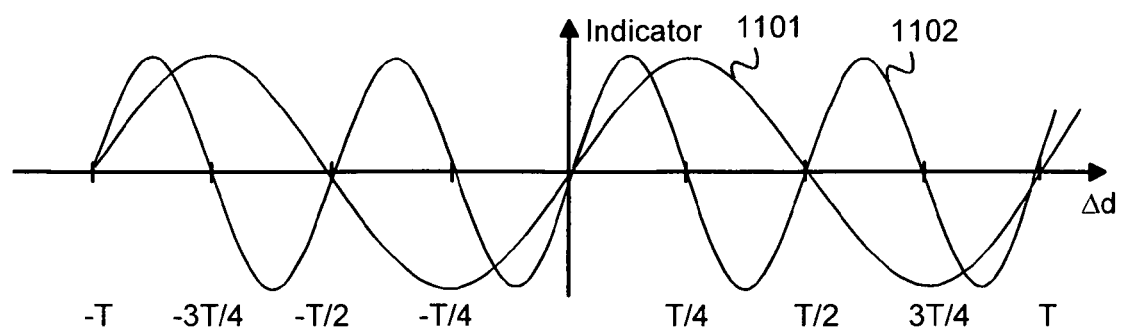
FIG. 11 shows an indicator of delay mismatch as functions of the delay mismatch in a measurement arrangement according to an embodiment of the invention.

From FIG. 10 and from equation (8) we can conclude that the indicator 904 is a periodic function of the delay mismatch Δd such that a period of said periodic function is $1/f_m$. In FIG. 11 a curve 1101 illustrates a principled form of the periodic function when ΔΦ=0 and $f_m=f_{m0}$ and a curve 1102 illustrates a principled form of the periodic function when ΔΦ=0 and $f_m=2f_{m0}$. In FIG. 11 a period corresponding with $f_{m0}$ is denoted with T $(=1/f_{m0})$.

The processor 981 is disposed to compute an estimate for the delay mismatch Δd on the basis of said plurality of indicators. The estimate for is obtained in the following way:

The first measurement frequency $f_{m0}$ is selected so that equation (10) is satisfied and the phase shift ΔΦ is set to zero.

Therefore, a sign of the indicator 904 reveals if the delay mismatch Δd belongs to a range $-1/(2f_{m0}) \ldots 0$ or to a range $0 \ldots 1/(2f_{m0})$. Without loosing generality we can assume that Δd belongs to the range $0 \ldots 1/(2f_{m0})$.

The second measurement frequency is selected to be $2f_{m0}$. Therefore, a sign of the indicator reveals if the delay mismatch Δd belongs to a range $0 \ldots 1/(4f_{m0})$ or to a range $1/(4f_{m0}) \ldots 1/(2f_{m0})$. Without loosing generality we can assume that Δd belongs to the range $0 \ldots 1/(4f_{m0})$.

The third measurement frequency is selected to be $4f_{m0}$. Therefore, a sign of the indicator reveals if the delay mismatch Δd belongs to a range $0 \ldots 1/(8f_{m0})$ or to a range $1/(8f_{m0}) \ldots 1/(4f_{m0})$.

The fourth measurement frequency is selected to be $8f_{m0}$, the fifth measurement frequency is selected to be $16f_{m0}$, and so on.

The above-described process can be continued as long as the range including the delay mismatch is so short that the delay mismatch is known with a sufficient accuracy.

In a measurement arrangement according to an embodiment of the invention the processor 981 is disposed to use the indicator 904 as an input signal of a regulator an output value of which controls at least one of the adjustable delay elements 914 and 915. The phase shift ΔΦ is set to be zero and the measurement frequency $f_m$ is selected so that $$f_m < \frac{1}{4 \times \text{Max}\Delta d}. \tag{11}$$

An absolute value of the delay mismatch Δd is less or equal MaxΔd. Therefore, with this selection the indicator 904 is a monotonous function of the delay mismatch Δd as can be seen from the curve 1101 in FIG. 11; abs(Δd)<T/4, where T is $1/f_m$ and abs(·) means an absolute value. The regulator can be for example a standard PI-regulator according to prior art (Proportional and Integrating regulator).

With laboratory measurements and/or with simulations it can be observed that magnitudes of spectrum peaks of the polar modulated signal 903 fluctuate substantially in a sinusoidal way when the phase difference D is increased or decreased and when the alternating components of the measurement signals 901 and 902 are substantially sinusoidal. For example, magnitudes $a1_k$ and $a2_k$ corresponding with spectrum peaks at frequencies $f1=f_c+kf_m$ and $f2=f_c-kf_m$, where k is a positive integer, have substantially the following forms:

$$a1_k = h1_k - h2_k \sin(D), \text{ and}$$

$$a2_k = h2_k = h2_k \sin(D), \tag{12}$$

where $h1_k$ and $h2_k$ are parameters that depends on the positive integer k. The spectrum peak at f1 belongs to the upper side band and the spectrum peak at f2 belongs to the lower side band. Different waveforms can be tested with simulations and/or with measurement tests to find out if they are so close to a sinusoid that they can be used as the measurement signals 901 and 902 for obtaining the above-mentioned behaviour of the magnitudes.

A difference between the amplitudes $a1_k$ and $a2_k$ is $$a2_k - a1_k = 2h2_k \sin(D). \tag{13}$$

Therefore, a difference between magnitude of a spectrum peak at the lower side band and magnitude of a corresponding spectrum peak at the upper side band is substantially a sinusoidal function of the phase difference D.

In an earlier part of this document and with the aid of FIGS. 5, 6a, 6b, and 7 it has been described how to measure a quantity that is linearly proportional to the amplitude of a sinusoidal signal representing a spectrum peak. This amplitude represents the magnitude of the spectrum peak. In a measurement arrangement according to an embodiment of the invention the measurement circuitry 912 (FIG. 9) are adapted to measure the indicator 904 as a quantity that is linearly proportional to a difference between the magnitude associated with a spectrum peak at the lower side band and the magnitude associated with a corresponding spectrum peak at the upper side band. Therefore, the indicator 904 is substantially a sinusoidal function of the phase difference D and it can be modelled as A sin(D), where A is a constant.

A difference ΔP between the power represented by the lower side band and the power represented by the upper side band is:

$$\Delta P = \sum_k a2_k^2 - \sum_k a1_k^2 = \sum_k (a2_k^2 - a1_k^2). \tag{14}$$

Using equations (12) we get:

$$a2_k^2 - a1_k^2 = 4h1_k h2_k \sin(D). \tag{15}$$

Therefore, equation (14) yields:

$$\Delta P = \left[\sum_k 4h1_k h2_k\right] \sin(D). \tag{16}$$

Therefore, a quantity that is linearly proportional to a difference ΔP between the power represented by the lower side band and the power represented by the upper side band is substantially a sinusoidal function of the phase difference D. From equations (14)-(16) it can be concluded that this fact is valid also when only a part the lower side band and a corresponding part of the upper side band are taken into consideration, i.e. the summing index k does not need to go through all the spectrum peaks.

In an earlier part of this document and with the aid of FIGS. 5, 6a, 6b, and 7 it has been described how to measure a quantity that is linearly proportional to the power represented by the upper side band or by the lower side band. In a measurement arrangement according to an embodiment of the invention the measurement circuitry 912 (FIG. 9) are adapted to measure the indicator 904 as a quantity that is linearly proportional to a difference between the power represented by the lower side band and the power represented by the upper side band. Therefore, the indicator 904 is substantially a sinusoidal function of the phase difference D and it can be modelled as A sin(D), where A is a constant.

In a measurement arrangement according to an embodiment of the invention the processor 981 is adapted to make the signal generator 910 and the measurement circuitry 912 to perform two measurements for producing a first indicator I1 with D=$2\pi f_m \Delta d$ and a second indicator I2 with D=$2\pi f_m \Delta d + \pi/2$. The indicators I1 and I2 are:

$$I1 = A \sin(2\pi f_m \Delta d) \text{ and}$$

$$I2 = A \sin(f_m \Delta d + \pi/2) = -A \cos(2\pi f_m \Delta d), \tag{17}$$

where the measurement frequency $f_m$ is selected according to equation (10), i.e. abs($2\pi f_m \Delta d$)<π.

The processor 981 is further adapted to calculate an estimate for the delay mismatch Δd with the aid of I1 and I2. Calculation of the estimate can be based, for example, on the fact that $$I1/I2 = -\tan(2\pi f_m \Delta d)$$

and on the fact that a quadrant of the range −π . . . +π that includes $2\pi f_m \Delta d$ can be identified with the aid of a sign of I1 and a sign of I2, where the quadrants are the ranges −π . . . −π/2, −π/2 . . . 0, 0 . . . π/2, and π/2 . . . π. A value of $2\pi f_m \Delta d$ that corresponds with the quotient I1/I2 can be obtained e.g. with an arc tan lookup table.

In a measurement arrangement according to an embodiment of the invention the processor 981 is adapted to make the signal generator 910 and the measurement circuitry 912 to perform a plurality of measurements for producing a plurality of indicators {I1, I2, . . . , In} such that a k:th indicator k (k=1, . . . , n) corresponds with a phase shift D=$2\pi f_m \Delta d + \Phi k$. The indicators are:

$$I1 = A \sin(2\pi f_m \Delta d + \Phi 1),$$

$$I2 = A \sin(2\pi f_m \Delta d + \Phi 2),$$

$$\ldots$$

$$In = A \sin(2\pi f_m \Delta d + \Phi n), \quad (18)$$

where the measurement frequency $f_m$ is selected according to equation (10), i.e. abs($2\pi f_m \Delta d$)<$\pi$, and A and $\Delta d$ are unknown quantities. The processor 981 is further adapted to find estimates $\Delta d_e$ and $A_e$ for $\Delta d$ and A, respectively, so that a norm of the following error vector E is minimized:

$$E = \begin{bmatrix} I1 - A_e \sin(2\pi f_m \Delta d_e + \Phi 1) \\ I2 - A_e \sin(2\pi f_m \Delta d_e + \Phi 2) \\ \ldots \\ In - A_e \sin(2\pi f_m \Delta d_e + \Phi n) \end{bmatrix}. \quad (19)$$

In a general case a task to minimize the norm of the error vector E does not have an unambiguous solution. In this case, however, the solution is unambiguous because there are the following boundary conditions: $-\pi < 2\pi f_m \Delta d < \pi$, and A>0. There are numerous methods for minimizing the norm of the error vector E with respect to $\Delta d_e$ and $A_e$, e.g. the gradient method and the conjugate gradient method.

The above-mentioned process for finding an estimate $\Delta d_e$ for the delay mismatch is actually a curve fitting process in which a sinusoid is adapted to fit with the measured indicators (I1, I2, . . . , In) by adjusting the amplitude and the phase of said sinusoid. Effect of stochastic measurement errors in the estimate $\Delta d_e$ can be mitigated by increasing the number of the measured indicators (I1, I2, . . . , In).

In a measurement arrangement according to an embodiment of the invention the processor 981 is adapted to control at least one of the adjustable delay elements 914 and 915 and to make the measurement circuitry 912 to perform a plurality of measurements for producing a plurality of indicators {I1, I2, . . . , In} such that a k:th indicator k (k=1, . . . , n) corresponds with an individual setting of at least one of the adjustable delay elements 914 and 915. The indicators are:

$$I1 = A \sin(2\pi f_m (\Delta d + d1)),$$

$$I2 = A \sin(2\pi f_m (\Delta d + d2)),$$

$$\ldots$$

$$In = A \sin(2\pi f_m (\Delta d + dk)), \quad (20)$$

where the measurement frequency $f_m$ is selected according to equation (10), i.e. abs($2\pi f_m \Delta d$)<$\pi$, A and $\Delta d$ are unknown quantities, and d1, . . . , dk are values of an adjustable portion of the delay mismatch created with at least one of the adjustable delay elements 914 and 915. Estimates for the unknown quantities A and $\Delta d$ can be found with the above-described curve fitting process.

Figure 12:
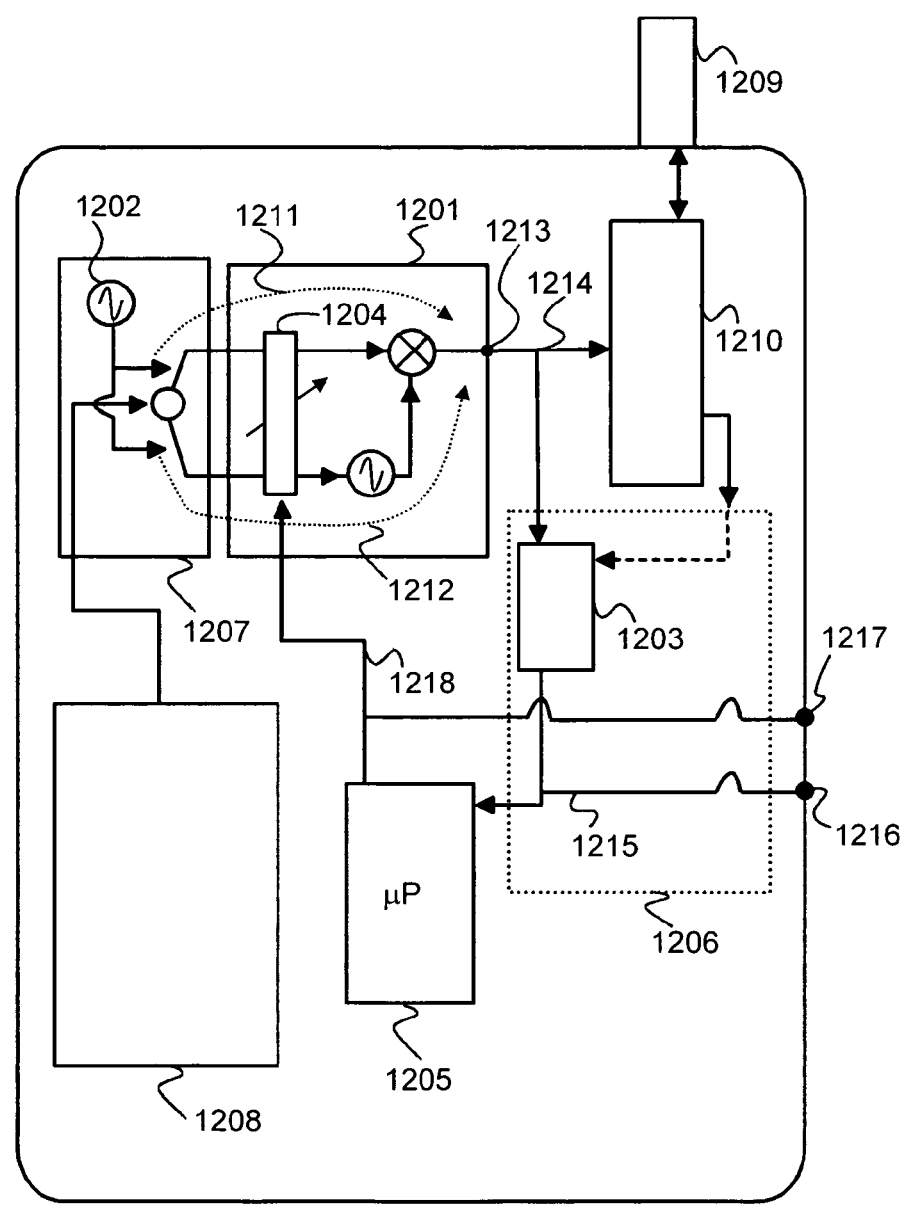
FIG. 12 shows a mobile communication device according to an embodiment of the invention.

FIG. 12 shows a mobile communication device according to an embodiment of the invention. The mobile communication device comprises a polar modulator 1201 having an amplitude information path (A-path) 1211, a phase information path (P-path) 1212, and a signal output 1213 for a polar modulated signal 1214. The mobile communication device comprises a signal generator 1202 disposed to feed a first measurement signal having a substantially sinusoidal alternating component into an amplitude information path 1212 of the polar modulator and to feed a second measurement signal having a substantially sinusoidal alternating component into a phase information path 1213 of the polar modulator. The alternating component of the first measurement signal and the alternating component of the second measurement signal have same frequency. The mobile communication device comprises a measurement circuitry 1203 disposed to measure an indicator of delay mismatch 1215 as a quantity proportional to a difference between power represented by a lower side band of a spectrum of the polar modulated signal 1214 and power represented by an upper side band of said spectrum, where the delay mismatch is a difference between a propagation delay on the amplitude information path 1211 and a propagation delay on the phase information path 1212. The mobile communication device comprises an adjustable delay module 1204 disposed to produce an adjustable delay on at least one of the following: the amplitude information path 1211 and the phase information path 1212.

The mobile communication device according to an embodiment of the invention can also comprise a control output terminal 1216 disposed to transmit the indicator 1215 out of the mobile communication device and a control input terminal 1217 disposed to receive a control value 1218 for the adjustable delay module 1204.

The mobile communication device according to an embodiment of the invention can also comprise a processor 1205 disposed to control the adjustable delay module 1204 on the basis of the indicator 1215 so that the delay mismatch is minimized. Optimal settings for the adjustable delay module can be determined according to a calculated estimate of the delay mismatch or the settings can be found using a search process based on the sign of the indicator. Different search processes and ways to calculate the estimate have been described in earlier parts of this document In the mobile communication device according to an embodiment of the invention the measurement circuitry 1203 can be at least partly realized with signal processing means of a receiver unit 1206. The receiver unit 1206 comprises a down modulator, filters, and a power measurement unit that can be adapted to measure the indicator 1215. In this case the polar modulated signal 1214 can be transferred to the measurement circuitry 1203 via a duplexer and antenna front-end element 1210.

In the mobile communication device according to an embodiment of the invention the signal generator 1202 can be at least partly realized with a digital base-band system 1207 that is a part of a transmitter of the mobile communication device. If generating the first measurement signal and the second measurement signal introduces any delays or latencies, which differ from those encountered during a normal data transmission operation, then these must be taken into account during calculating the delay mismatch and/or during adjusting the adjustable delay module 1204.

A block 1208 represents all the parts of the mobile communication device that provides an input signal to the digital base-band system 1207: a microphone, an analog-to-digital converter, a codec, etc. The receiver unit 1206 includes all the parts of the mobile communication device that process a signal arriving from an antenna 1209 via the duplexer and antenna front-end element 1210: a demodulator, equalizers, filtering systems, controllers, a speaker, etc.

The mobile communication device according to an embodiment of the invention is a mobile phone.

A set of integrated circuits according to the invention comprises one or more integrated circuits (IC) that include:
- a signal generator disposed to feed a first measurement signal having a substantially sinusoidal alternating component into an amplitude information path of a polar modulator and to feed a second measurement signal having a substantially sinusoidal alternating component into a phase information path of the polar modulator, the alternating component of said first measurement signal and the alternating component of said second measurement signal having same frequency, and
- a measurement circuitry disposed to measure an indicator of delay mismatch as a quantity proportional to a difference between power represented by a lower side band of a spectrum of an output signal of the polar modulator and power represented by an upper side band of said spectrum.

Figure 13:
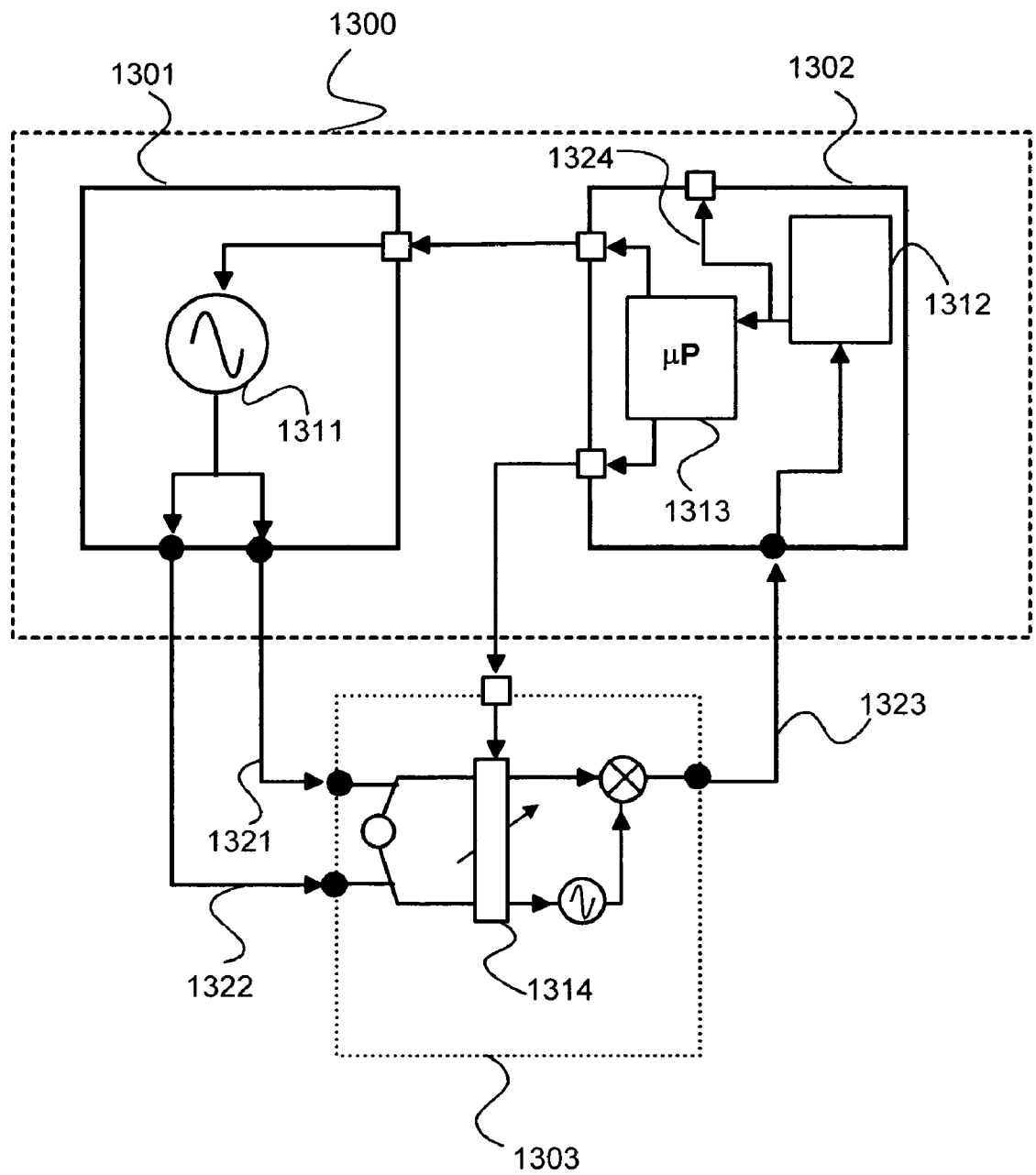
FIG. 13 shows an example of a set of integrated circuits according to an embodiment of the invention.

An example of a set of integrated circuits (chip-set) according to an embodiment of the invention is shown in FIG. 13. This exemplary chip-set 1300 comprises two integrated circuits 1301 and 1302. The integrated circuit 1301 includes a signal generator 1311 according to any of the embodiments described above and with the aid of FIGS. 8a-8d. The integrated circuit 1302 includes a measurement circuitry 1312 according to any of the embodiments described above and with the aid of FIGS. 5, 6a, 6b, and 7. A block 1303 represents a polar modulator that is connected to the integrated circuits 1301 and 1302. Black circles denote signal interfaces and white squares denote control interfaces on boundaries of the integrated circuits 1301 and 1302 and the polar modulator 1303. The signal generator 1311 produces a first measurement signal 1321 that is connected to an amplitude information path of the polar modulator 1303 and a second measurement signal 1322 that is connected to a phase information path of the polar modulator. An output signal 1323 of the polar modulator is connected to the measurement circuitry 1312 that produces an indicator of delay mismatch 1324 between the amplitude information path and the phase information path.

In the set of integrated circuits according to an embodiment of the invention one of the integrated circuits can comprise a processor 1313 disposed to control an adjustable delay module 1314 of the polar modulator on the basis of the indicator 1324. The adjustable delay module 1314 produce an adjustable delay on at least one of the following: the amplitude information path and the phase information path.

In the set of integrated circuits according to an embodiment of the invention one of the integrated circuits can include a polar modulator unit.

Figure 14:
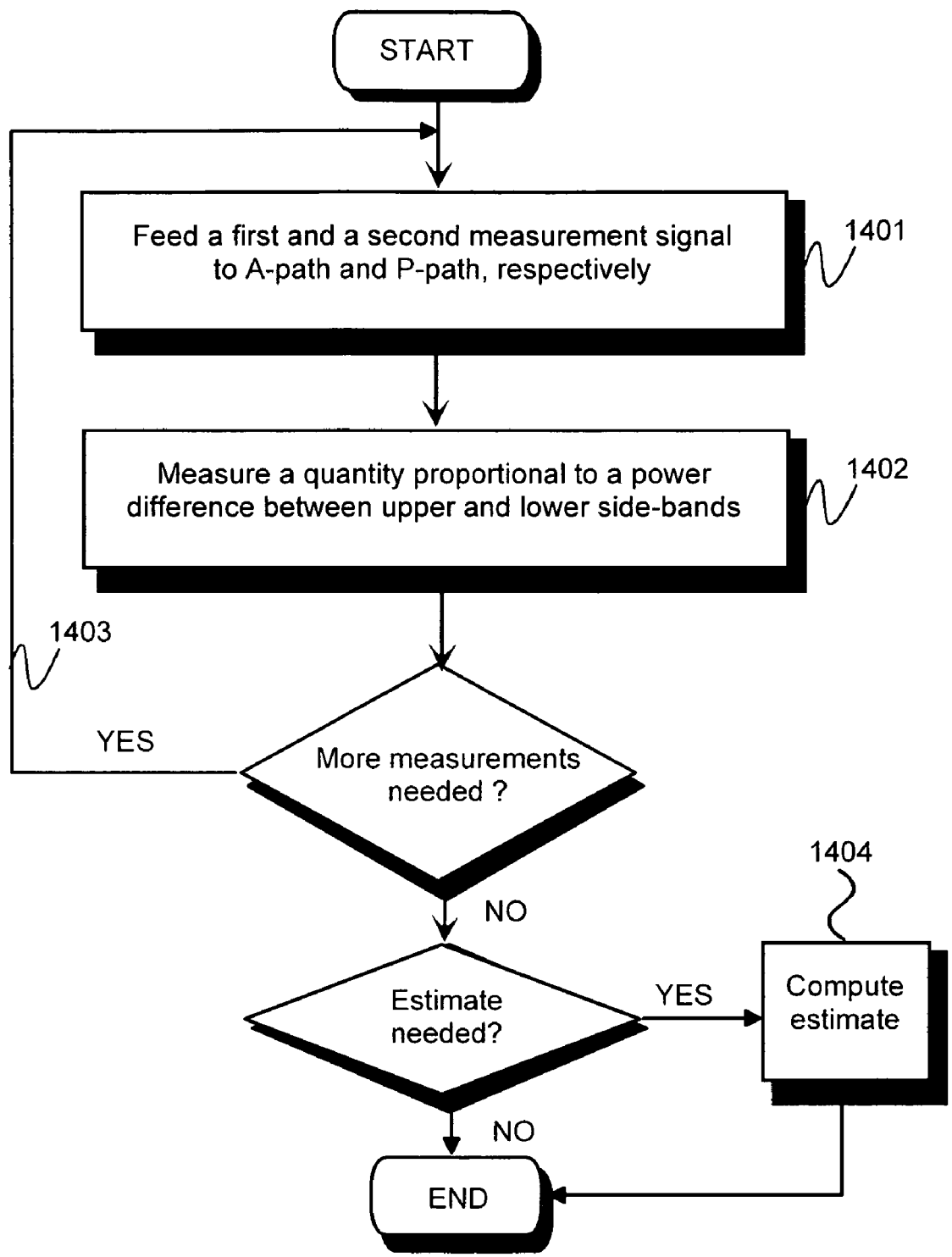
FIG. 14 shows a flow chart for a method according to an embodiment of the invention for measuring an indicator of delay mismatch for a polar modulator.

FIG. 14 shows a flow chart for a method according to an embodiment of the invention for measuring an indicator of delay mismatch of a polar modulator. In phase 1401 a first measurement signal having a substantially sinusoidal alternating component is fed into an amplitude information path (A-path) of the polar modulator and a second measurement signal having a substantially sinusoidal alternating component is fed into a phase information path (P-path) of the polar modulator so that the alternating component of the first measurement signal and the alternating component of the second measurement signal have same frequency. In phase 1402 the indicator is measured as a quantity that is proportional to a difference between power represented by a lower side band of a spectrum of an output signal of the polar modulator and power represented by an upper side band of said spectrum.

In the measurement method according to an embodiment of the invention the first measurement signal and the second measurement signal are produced so that the alternating component of said first measurement signal and the alternating component of said second measurement signal have a phase shift having a pre-determined value.

In the measurement method according to an embodiment of the invention a phase shift between the alternating component of the first measurement signal and the alternating component of the second measurement signal is detected with a phase detector.

In the measurement method according to an embodiment of the invention the sign of the delay mismatch is computed on the basis of said indicator.

In the measurement method according to an embodiment of the invention successive measurements are performed 1403 in order to produce a plurality of indicators corresponding with a plurality of values of the phase shift and an estimate for the delay mismatch is computed 1404 on the basis of said plurality of indicators. The estimate can be computed for example with the curve fitting process described in an earlier part of this document.

In the measurement method according to an embodiment of the invention successive measurements are performed 1403 in order to produce a plurality of indicators corresponding with a plurality of values of the frequency associated with the alternating component of the first measurement signal and the alternating component of the second measurement signal. An estimate for the delay mismatch is computed on the basis of the plurality of indicators. In the successive measurements a value of the frequency used in a later performed measurement is two times a value of the frequency used in an earlier performed measurement.

In the measurement method according to an embodiment of the invention successive measurements are performed 1403 in order to produce a plurality of indicators corresponding with a plurality of setting values of at least one of the following: a first adjustable delay element on the amplitude information path of the polar modulator and a second adjustable delay element on the phase information path of the polar modulator. An estimate for the delay mismatch is computed 1404 on the basis of said plurality of indicators. The estimate can be computed for example with the curve fitting process described in an earlier part of this document.

In the measurement method according to an embodiment of the invention the indicator is measured with a spectrum analyzer.

It will be evident to any person skilled in the art that the invention and its embodiments are thus not limited to the above-described examples, but may vary within the scope of the independent claims.

What is claimed is:

1. A measurement arrangement comprising:
   a signal generator configured to feed a first measurement signal having a substantially sinusoidal alternating component into an amplitude information path of a polar modulator and to feed a second measurement signal having a substantially sinusoidal alternating component into a phase information path of the polar modulator, the alternating component of said first measurement signal and the alternating component of said second measurement signal having the same frequency, wherein the signal generator is configured to produce said first measurement signal and said second measurement signal so that the alternating component of said first measurement signal and the alternating component of said second measurement signal have a phase shift having a pre-determined value;
   a measurement circuitry configured to measure an indicator of delay mismatch as a quantity proportional to a difference between power represented by a lower side band of a spectrum of an output signal of the polar modulator and power represented by an upper side band of said spectrum, said delay mismatch being a difference between a propagation delay on the amplitude information path of the polar modulator and a propagation delay on the phase information path of the polar modulator so that said quantity includes a sign of said difference between the propagation delay on the amplitude information path of the polar modulator and the propagation delay on the phase information path of the polar modulator; and a processor configured to cause the signal generator and the measurement circuitry to perform successive measurements to produce a plurality of indicators corresponding with a plurality of values of the frequency associated with the alternating component of said first measurement signal and the alternating component of said second measurement signal.

2. The measurement arrangement according to claim 1, comprising a phase detector configured to detect a phase shift between the alternating component of said first measurement signal and the alternating component of said second measurement signal.

3. The measurement arrangement according to claim 1, comprising a processor configured to compute the sign of said delay mismatch on the basis of said indicator.

4. The measurement arrangement according to claim 1, comprising a processor configured to cause the signal generator and the measurement circuitry to perform successive measurements to produce a plurality of indicators corresponding with a plurality of values of the phase shift.

5. The measurement arrangement according to claim 4, wherein said processor is configured to compute an estimate for said delay mismatch on the basis of said plurality of indicators.

6. The measurement arrangement according to claim 1, wherein said processor is configured to compute an estimate for said delay mismatch on the basis of said plurality of indicators.

7. The measurement arrangement according to claim 1, comprising a processor configured to control an adjustable portion of said delay mismatch, said adjustable portion being provided with at least one of the following: a first adjustable delay element on the amplitude information path of the polar modulator and a second adjustable delay element on the phase information path of the polar modulator.

8. The measurement arrangement according to claim 7, wherein said processor is configured to cause the signal generator and the measurement circuitry to perform successive measurements to produce a plurality of indicators corresponding with a plurality of values of the adjustable portion of said delay mismatch.

9. The measurement arrangement according to claim 8, comprising a processor configured to compute an estimate for said delay mismatch on the basis of said plurality of indicators.

10. The measurement arrangement according to claim 1, wherein said measurement circuitry comprises:

a filter unit configured to form a first amplitude response that is more suppressive on the upper side band than on the lower side band and a second amplitude response that is more suppressive on the lower side band than on the upper side band, said filter unit further configured to filter a waveform of the output signal of the polar modulator, a detector unit configured to produce a first level value from a signal produced with the filter unit using the first amplitude response and a second level value from a signal produced with the filter unit using the second amplitude response, and a subtraction element configured to produce said indicator as a difference between the first level value and the second level value.

11. The measurement arrangement according to claim 1, wherein said measurement circuitry comprises:

a down-modulation unit configured to perform down-modulation with a first down-modulation frequency that is lower than a center frequency of the output signal of the polar modulator and to perform down-modulation with a second down-modulation frequency that is higher than said center frequency, said down-modulation unit being arranged to down-modulate a waveform of the output signal of the polar modulator, a detector unit configured to produce a first level value from a signal produced with the down-modulation unit using the first down-modulation frequency and a second level value from a signal produced with the down-modulation unit using the second down-modulation frequency, and a subtraction element configured to produce said indicator as a difference between the first level value and the second level value.

12. The measurement arrangement according to claim 1, wherein said measurement circuitry is a spectrum analyzer.

13. The measurement arrangement according to claim 1, wherein the signal generator is configured to produce the first measuring signal with such an offset component that a value of the first measuring signal has a constant polarity.

14. A mobile communication device comprising:

a polar modulator;

a signal generator configured to feed a first measurement signal having a substantially sinusoidal alternating component into an amplitude information path of the polar modulator and to feed a second measurement signal having a substantially sinusoidal alternating component into a phase information path of the polar modulator, the alternating component of said first measurement signal and the alternating component of said second measurement signal having the same frequency, wherein the signal generator is configured to produce said first measurement signal and said second measurement signal so that the alternating component of said first measurement signal and the alternating component of said second measurement signal have a phase shift having a predetermined value;

a measurement circuitry configured to measure an indicator of delay mismatch as a quantity proportional to a difference between power represented by a lower side band of a spectrum of an output signal of the polar modulator and power represented by an upper side band of said spectrum, said delay mismatch being a difference between a propagation delay on the amplitude information path of the polar modulator and a propagation delay on the phase information path of the polar modulator so that said quantity includes a sign of said difference between the propagation delay on the amplitude information path of the polar modulator and the propagation delay on the phase information path of the polar modulator;

a processor configured to cause the signal generator and the measurement circuitry to perform successive measurements to produce a plurality of indicators corresponding with a plurality of values of the frequency associated with the alternating component of said first measurement signal and the alternating component of said second measurement signal; and an adjustable delay module configured to produce adjustable delay on at least one of the following: the amplitude information path of the polar modulator and the phase information path of the polar modulator.

15. The mobile communication device according to claim 14, comprising a control output terminal configured to transmit said indicator out of the mobile communication device and a control input terminal configured to receive a control value for said adjustable delay module.

16. The mobile communication device according to claim 14, comprising a processor configured to control said adjustable delay module on the basis of said indicator.

17. The mobile communication device according to claim 14, wherein said measurement circuitry is at least partly realized with a receiver unit of the mobile communication device.

18. The mobile communication device according to claim 14, wherein the mobile communication device is a mobile phone.

19. The mobile communication device according to claim 14, wherein said signal generator is at least partly realized with a digital base-band system of a transmitter unit of the mobile communication device.

20. A set of integrated circuits comprising the following elements realized in one or more integrated circuit:
a signal generator configured to feed a first measurement signal having a substantially sinusoidal alternating component into an amplitude information path of a polar modulator and to feed a second measurement signal having a substantially sinusoidal alternating component into a phase information path of the polar modulator, the alternating component of said first measurement signal and the alternating component of said second measurement signal having the same frequency, wherein the signal generator is configured to produce said first measurement signal and said second measurement signal so that the alternating component of said first measurement signal and the alternating component of said second measurement signal have a phase shift having a pre-determined value;
a measurement circuitry configured to measure an indicator of delay mismatch as a quantity proportional to a difference between power represented by a lower side band of a spectrum of an output signal of the polar modulator and power represented by an upper side band of said spectrum, said delay mismatch being a difference between a propagation delay on the amplitude information path of the polar modulator and a propagation delay on the phase information path of the polar modulator so that said quantity includes a sign of said difference between the propagation delay on the amplitude information path of the polar modulator and the propagation delay on the phase information path of the polar modulator; and
a processor configured to cause the signal generator and the measurement circuitry to perform successive measurements to produce a plurality of indicators corresponding with a plurality of values of the frequency associated with the alternating component of said first measurement signal and the alternating component of said second measurement signal.

21. The set of integrated circuits according to claim 20, wherein one of the integrated circuits comprises a processor configured to control, on the basis of said indicator, at least one of the following: a first adjustable delay element on the amplitude information path of the polar modulator and a second adjustable delay element on the phase information path of the polar modulator.

22. The set of integrated circuits according to claim 20, wherein one of the integrated circuits comprises a polar modulator unit.

23. A method comprising:
feeding a first measurement signal having a substantially sinusoidal alternating component into an amplitude information path of a polar modulator;
feeding a second measurement signal having a substantially sinusoidal alternating component into a phase information path of the polar modulator so that the alternating component of said first measurement signal and the alternating component of said second measurement signal have the same frequency, wherein said first measurement signal and said second measurement signal are produced so that the alternating component of said first measurement signal and the alternating component of said second measurement signal have a phase shift having a pre-determined value;
measuring an indicator of delay mismatch as a quantity proportional to a difference between power represented by a lower side band of a spectrum of an output signal of the polar modulator and power represented by an upper side band of said spectrum, said delay mismatch being a difference between a propagation delay on the amplitude information path of the polar modulator and a propagation delay on the phase information path of the polar modulator so that said quantity includes a sign of said difference between the propagation delay on the amplitude information path of the polar modulator and the propagation delay on the phase information path of the polar modulator; and
performing successive measurements to produce a plurality of indicators corresponding with a plurality of values of the frequency associated with the alternating component of said first measurement signal and the alternating component of said second measurement signal.

24. The method according to claim 23, comprising detecting a phase shift between the alternating component of said first measurement signal and the alternating component of said second measurement signal.

25. The method according to claim 23, comprising computing the sign of said delay mismatch on the basis of said indicator.

26. The method according to claim 23, comprising performing successive measurements to produce a plurality of indicators corresponding with a plurality of values of the phase shift and computing an estimate for said delay mismatch on the basis of said plurality of indicators.

27. The method according to claim 23 comprising computing an estimate for said delay mismatch on the basis of said plurality of indicators, in the successive measurements a value of the frequency used in a later performed measurement being two times a value of the frequency used in an earlier performed measurement.

28. The method according to claim 23, comprising performing successive measurements to produce a plurality of indicators corresponding with a plurality of setting values of at least one of the following: a first adjustable delay element on the amplitude information path of the polar modulator and a second adjustable delay element on the phase information path of the polar modulator, and computing an estimate for said delay mismatch on the basis of said plurality of indicators.

29. The method according to claim 23, wherein said indicator is measured with a spectrum analyzer.

* * * * *